(12) United States Patent
Ichiyama et al.

(10) Patent No.: US 7,904,776 B2
(45) Date of Patent: Mar. 8, 2011

(54) JITTER INJECTION CIRCUIT, PATTERN GENERATOR, TEST APPARATUS, AND ELECTRONIC DEVICE

(75) Inventors: Kiyotaka Ichiyama, Tokyo (JP); Masahiro Ishida, Tokyo (JP)

(73) Assignee: Advantest Corporation, Tokyo (JP)

( * ) Notice: Subject to any disclaimer, the term of this patent is extended or adjusted under 35 U.S.C. 154(b) by 481 days.

(21) Appl. No.: 12/022,163

(22) Filed: Jan. 30, 2008

(65) Prior Publication Data

US 2009/0189667 A1 Jul. 30, 2009

(51) Int. Cl.
*G01R 31/3183* (2006.01)
*G01R 31/40* (2006.01)

(52) U.S. Cl. ........................... 714/744; 714/733

(58) Field of Classification Search ............... None
See application file for complete search history.

(56) References Cited

U.S. PATENT DOCUMENTS

| | | | |
|---|---|---|---|
| 4,998,253 A * | 3/1991 | Ohashi et al. | 714/791 |
| 5,889,435 A * | 3/1999 | Smith et al. | 331/1 A |
| 6,256,003 B1 * | 7/2001 | Tsuchiya et al. | 345/87 |
| 7,221,202 B1 * | 5/2007 | Yayla | 327/158 |
| 2004/0131089 A1 * | 7/2004 | Uemura et al. | 370/537 |
| 2005/0044463 A1 * | 2/2005 | Frisch | 714/738 |

FOREIGN PATENT DOCUMENTS

WO WO2007-049365 5/2007

* cited by examiner

*Primary Examiner* — Robert Beausoliel
*Assistant Examiner* — Dipakkumar Gandhi
(74) *Attorney, Agent, or Firm* — Osha Liang LLP

(57) ABSTRACT

Provided is a jitter injection circuit that generates a jittery signal including jitter, including a plurality of delay circuits that are connected in a cascading manner and that each sequentially delay a supplied reference signal by a preset delay amount and a signal generating section that generates each edge of the jittery signal according to a timing of the signal output by each delay circuit. In the jitter injection circuit the delay amount of at least one delay circuit is set to be a value different from an integer multiple of an average period of the jittery signal.

33 Claims, 31 Drawing Sheets

JITTER INJECTION CIRCUIT, PATTERN GENERATOR, TEST APPARATUS, AND ELECTRONIC DEVICE

BACKGROUND

1. Technical Field

The present invention relates to a jitter injection circuit, a pattern generator, a test apparatus, and an electronic device. More particularly, the present invention relates to a jitter injection circuit that generates a jittery signal containing jitter, a pattern generator that generates a data signal containing jitter, a test apparatus that tests a device under test using a test signal into which jitter is injected, and an electronic device provided with a self diagnostic section that tests a circuit under test using a test signal into which jitter is injected.

2. Related Art

A jitter tolerance testing is a type of testing performed for high speed communication devices and high speed serial I/O devices. For example, according to a recommendation from the ITU-T, a testing is defined in which jitter tolerance testing is performed by injecting jitter having a frequency of several hundred MHz into the communication data.

As a method for injecting jitter into a high frequency signal, a method is considered in which jitter is injected into a clock signal generated by a voltage controlled oscillator by injecting a modulated signal into a control input of the voltage controlled oscillator, and a data signal is then generated using the clock signal.

Another method is considered in which a variable delay circuit is disposed at a stage after a generator that generates a clock signal or a data signal and the jitter is injected by changing the delay control input of the variable delay circuit. An example of a jitter injection method using the variable delay circuit is disclosed in Pamphlet No. WO2007/049365.

During actual implementation of the electronic device, it is important to minimize the bit error ratio caused by the high frequency jitter component. Therefore, it is also desirable that the high frequency jitter be injected into the test apparatus testing the electronic device.

In a case where the jitter is generated by modulating the control input of the voltage controlled oscillator as described above, however, it is difficult to quickly modulate the clock signal with the control input, so that a frequency boundary of the generated jitter is only tens of MHz. In a case where the jitter is generated by changing the delay amount of the variable delay circuit, jitter having high frequency and large amplitude cannot be generated because the variable delay circuit requires time to catch up to the change of the delay setting section.

SUMMARY

Therefore, it is an object of an aspect of the innovations herein to provide a jitter injection circuit, a pattern generator, a test apparatus, and an electronic device, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary apparatus may include a jitter injection circuit that generates a jittery signal including jitter, including a plurality of delay circuits that are connected in a cascading manner and that each sequentially delay a supplied reference signal by a preset delay amount and a signal generating section that generates each edge of the jittery signal according to a timing of the signal output by each delay circuit. In the jitter injection circuit the delay amount of at least one delay circuit is set to be a value different from an integer multiple of an average period of the jittery signal.

According to a second aspect related to the innovations herein, one exemplary apparatus may include a test apparatus that tests a device under test, including a jitter injection circuit that generates a jittery signal containing jitter, a test signal generating section that generates a test signal based on the jittery signal and supplies the generated test signal to the device under test, and a measuring section that measures a response signal output by the performance circuit in response to the test signal and makes a judgment concerning pass/fail of the performance circuit based on the measured response signal. In the test apparatus, the jitter injection circuit includes a plurality of delay circuits that are connected in a cascading manner and that each sequentially delay a supplied reference signal by a preset delay amount and a signal generating section that generates each edge of the jittery signal according to a timing of the signal output by each delay circuit. Furthermore, in the test apparatus, the delay amount of at least one delay circuit is set to be a value different from an integer multiple of an average period of the jittery signal.

According to a third aspect related to the innovations herein, one exemplary apparatus may include an electronic device that houses a performance circuit and a self diagnostic section that tests the performance circuit. In the electronic device, the self diagnostic section includes a jitter injection circuit that generates a jittery signal containing jitter, a test signal generating section that generates a test signal based on the jittery signal and supplies the generated test signal to the performance circuit, and a measuring section that measures a response signal output by the performance circuit in response to the test signal and makes a judgment concerning pass/fail of the performance circuit based on the measured response signal. Furthermore, in the electronic device, the jitter injection circuit includes a plurality of delay circuits that are connected in a cascading manner and that each sequentially delay a supplied reference signal by a preset delay amount and a signal generating section that generates each edge of the jittery signal according to a timing of the signal output by each delay circuit. Yet further, in the electronic device, the delay amount of at least one delay circuit is set to be a value different from an integer multiple of an average period of the jittery signal.

According to a fourth aspect related to the innovations herein, one exemplary apparatus may include a pattern generator that generates a data signal that includes both jitter and a predetermined logic pattern, including a plurality of delay circuits that are connected in a cascading manner and that sequentially delay a supplied reference signal by a delay amount dependent on an integer multiple of a single bit unit time of the data signal and a signal generating section that generates each edge of the data signal according to a timing of the signal output by each delay circuit. In the pattern generator, the delay amount of at least one delay circuit is set to be a value obtained by adding or subtracting a jitter value to be injected to or from an integer multiple of the single bit unit time of the data signal.

According to a fifth aspect related to the innovations herein, one exemplary apparatus may include a test apparatus that tests a device under test, including a pattern generator that generates a test signal that includes both jitter and a predetermined logic pattern and supplies the test signal to the device under test and a measuring section that measures a response signal output by the performance circuit in response to the test signal and makes a judgment concerning pass/fail of the performance circuit based on the measured response signal. In the test apparatus, the pattern generator includes a plurality of delay circuits that are connected in a cascading manner and that sequentially delay a supplied reference signal by a delay amount dependent on an integer multiple of a single bit unit time of the data signal and a signal generating section that generates each edge of the test signal according to a timing of the signal output by each delay circuit. Furthermore, in the test apparatus, the delay amount of at least one delay circuit is set to be a value obtained by adding or subtracting a jitter value to be injected to or from an integer multiple of the single bit unit time of the test signal.

According to a sixth aspect related to the innovations herein, one exemplary apparatus may include an electronic device that that houses a performance circuit and a self diagnostic section that tests the performance circuit. In the electronic device, the self diagnostic section includes a pattern generator that generates a test signal that includes both jitter and a predetermined logic pattern and supplies the test signal to the device under test and a measuring section that measures a response signal output by the performance circuit in response to the test signal to make a judgment concerning pass/fail of the performance circuit. Furthermore, in the electronic device, the pattern generator includes a plurality of delay circuits that are connected in a cascading manner and that sequentially delay a supplied reference signal by a delay amount dependent on an integer multiple of a single bit unit time of the test signal and a signal generating section that generates each edge of the test signal according to a timing of the signal output by each delay circuit. Yet further, in the electronic device, the delay amount of at least one delay circuit is set to be a value obtained by adding or subtracting a jitter value to be injected to or from an integer multiple of the single bit unit time of the test signal.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
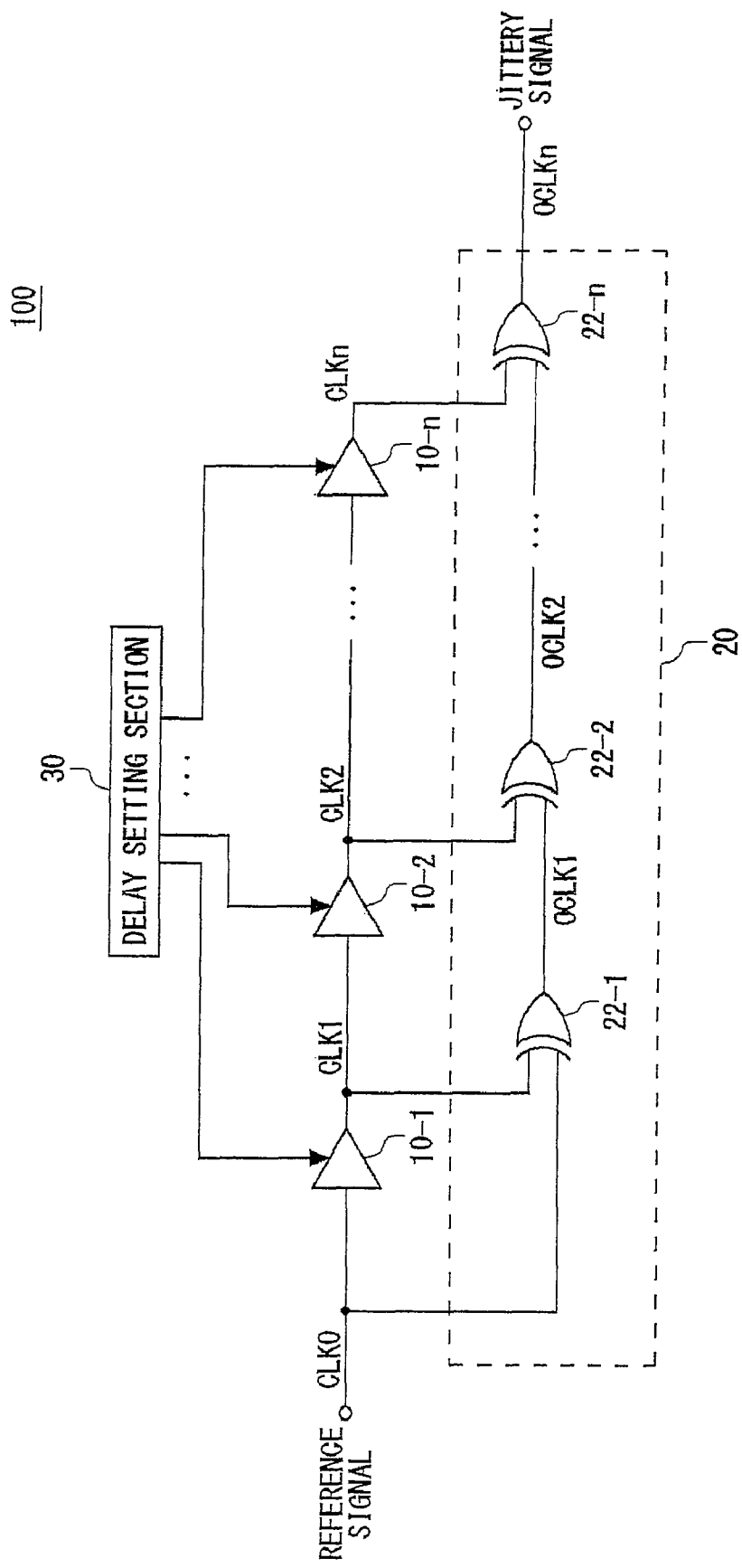
FIG. 1 shows an exemplary configuration of a jitter injection circuit 100 according to an embodiment.

FIG. 1 shows an exemplary configuration of a jitter injection circuit 100 according to an embodiment. The jitter injection circuit 100 is a circuit that generates a jittery signal containing jitter, and is provided with a plurality of delay circuits 10 connected in a cascading manner, a signal generating section 20, and a delay setting section 30. When generating the jittery signal, the jitter injection circuit 100 of the present embodiment generates the jittery signal using the plurality of delay circuits 10 having fixed delay amounts. More specifically, the jittery signal containing high frequency jitter can be easily generated because the jittery signal can be generated without changing the delay amounts of the delay circuits 10.

Each of the plurality of delay circuits 10 delays a signal supplied from the delay circuit 10 disposed at a stage immediately prior by a predetermined delay amount and transfers the delayed signal to the delay circuit 10 disposed at a stage immediately thereafter. The delay circuit 10 disposed at a first stage is supplied with the reference signal CLK0. The reference signal CLK0 may be a periodic signal having a predetermined period.

The signal generating section 20 generates each edge of the jittery signal to be output according to a timing of the signal output by each delay circuit 10. For example, the signal generating section 20 generates one edge of the jittery signal based on the edge of the signal output by one of the delay circuits 10. Because of this, a position of each edge of the jittery signal can be set according to the delay amount of the corresponding delay circuit 10, so that jitter corresponding to the delay amounts of the plurality of delay circuits 10 can be injected into the jittery signal.

The signal generating section 20 of the present embodiment includes a plurality of logic circuits 22 disposed in a manner to correspond one-to-one with the plurality of delay circuits 10. The logic circuits 22 in the present embodiment may be exclusive OR circuits. The logic circuit 22-1 at the first stage outputs an exclusive OR OCLK1 of an input signal CLK0 and an output signal CLK1 of the delay circuit 10-1 at the first stage. The logic circuits 22-k from the second stage onward (where k is an integer greater than or equal to two) output an exclusive OR OCLK(k) of the output signal CLKk of the delay circuit 10-k at a k-th stage and an output signal OCLK(k−1) of the logic circuit 22-(k−1) at an immediately prior stage.

When using such a configuration, the signal generating section 20 outputs a jittery signal in which the logic values are sequentially inverted at time intervals of the delay amounts τ1, τ2, τ3, ..., τk, ..., τn (note that τk is the delay amount set by the delay circuit 10 at a k-th stage) designated by each of the delay circuits 10. Here, by setting at least one of the delay amounts τk to be a value different than the average period $T_{OUT}$ of the jittery signal (a mean duration of each bit in the jittery signal), a jittery signal can be generated that includes period jitter according to the delay amount τk. The signal including the period jitter may refer to a signal in which each period varies from the average period.

For example, in a case where a jitter injection circuit 100 at an n-th stage injects period jitter having a jitter frequency of $f_J(=2f_{OUT}/(n+1))$ and a sine wave with a jitter amplitude $A_J$ into the jittery signal, the delay amount τk to be set for the delay circuit 10 at the k-th stage is calculated by the following formula. The delay setting section 30 may set the delay amounts of the plurality of delay circuits 10 according to the formula below.

$$\tau_k = \frac{1}{2f_{out}} + A_J \sin\left(\frac{\pi f_J k}{f_{out}}\right)$$

It should be noted that $f_{out}$ indicates the frequency of the jittery signal and is expressed by $f_{out}=1/(2T_{out})$.

The delay setting section 30 sets the prescribed delay amount in advance for each delay circuit 10. Here, in a case where the delay amount of each delay circuit 10 is set in advance by the jitter injection circuit 100 to be the predetermined delay amount, the jitter injection circuit 100 need not be provided with the delay setting section 30.

The delay setting section 30 may set for each delay circuit 10 a delay amount according to the period jitter to be injected into each period of the jittery signal. For example, the delay setting section 30 may set as the delay amount of each delay circuit 10 a value obtained by adding or subtracting a value of the period jitter to be included in each bit of the jittery signal to or from an average period $T_{OUT}$ to be included in the jittery signal.

Because the delay amount of each delay circuit 10 is the duration of the corresponding bit in the jittery signal, a k-th cycle of the jittery signal includes period jitter of $\tau k - T_{OUT}$. The delay setting section 30 of the present embodiment fixes the delay amounts of the delay circuits 10 while the jitter injection circuit 100 generates the jittery signal.

Figure 2:
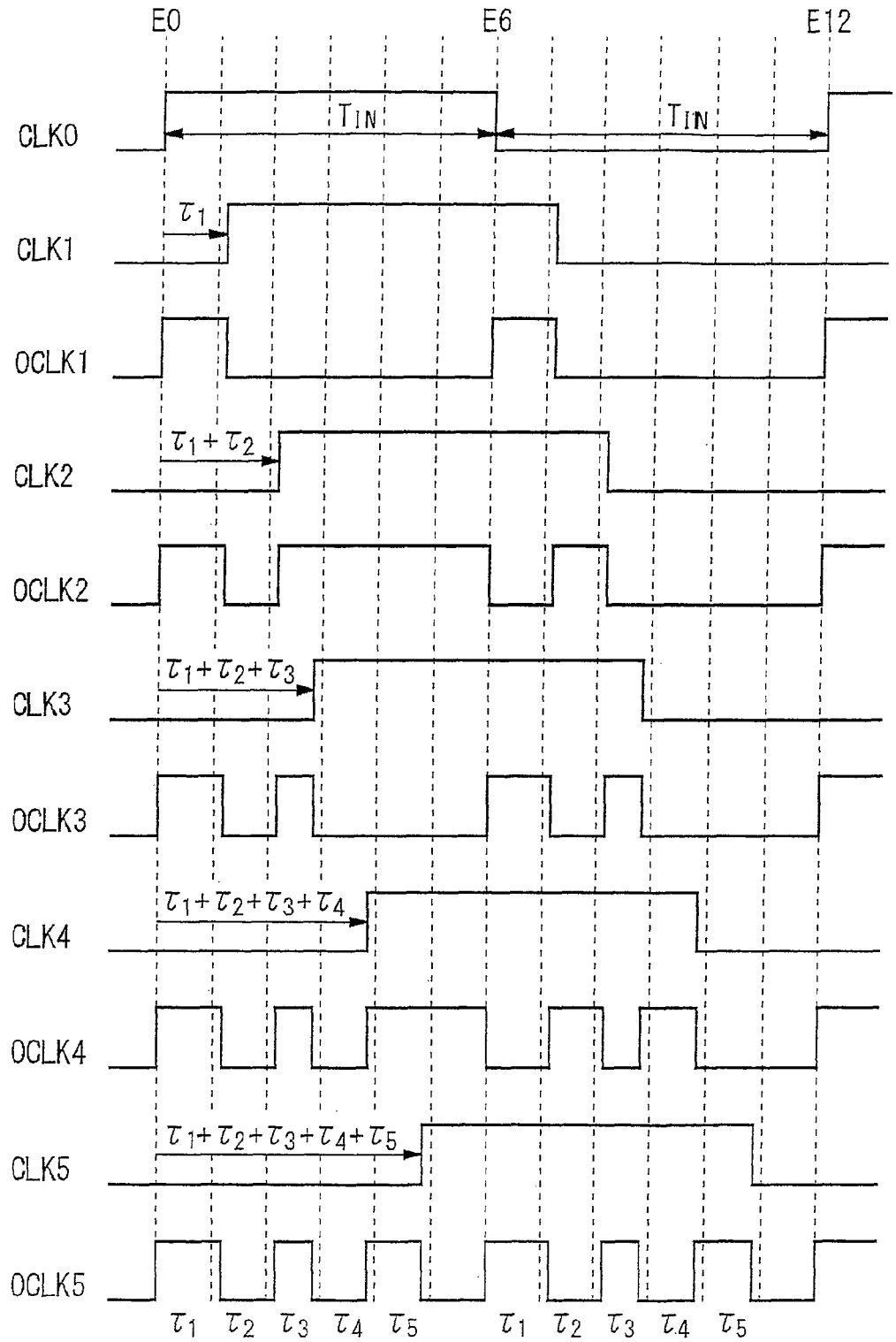
FIG. 2 is a timing chart showing an exemplary operation of the jitter injection circuit 100 shown in FIG. 1.

FIG. 2 is a timing chart showing an exemplary operation of the jitter injection circuit 100 shown in FIG. 1. In the present embodiment, an operation of the jitter injection circuit 100 provided with five stages of delay circuits 10 is described. Furthermore, the following description uses a signal in which the logic value repeatedly inverts at predetermined time intervals $T_{IN}$ as the reference signal CLK0.

The first stage delay circuit 10-1 delays the reference signal CLK0 by the delay amount τ1 and outputs the thus delayed signal. The delay amount τ1 may be a value calculated by adding or subtracting a prescribed jitter value to or from the average period $T_{OUT}$ of the jittery signal OCLK5.

Here, the delay setting section 30 may obtain the average period $T_{OUT}$ of the jittery signal OCLK5 by dividing a pulse width (bit duration) $T_{IN}$ of the reference signal CLK0 by a value equal to the stage number of the delay circuit 10 plus one. The delay setting section 30 may be provided with waveform data of the jitter to be injected. The delay setting section 30 may set the delay amount of each delay circuit 10 based on the average period $T_{OUT}$ and the waveform data.

The first stage logic circuit 22-1 outputs the exclusive OR OCLK1 of the reference signal CLK0 and the output signal CLK1 of the first stage delay circuit 10-1. In this manner, a signal is generated in which the logic value inverts at the time interval τ1.

The second stage delay circuit 10-2 delays the output signal CLK1 of the delay circuit 10-1 at the first stage by a delay amount τ2 and outputs the thus delayed signal. The delay amount τ2 may be a value calculated by adding or subtracting a prescribed jitter value to or from the average period $T_{OUT}$ of the jittery signal OCLK5. Furthermore, the delay amount τ2 may be a value different from the delay amount τ1.

The second stage logic circuit 22-2 outputs the exclusive OR OCLK2 of the output signal CLK2 of the second stage delay circuit 10-2 and the output signal OCLK1 of the first stage logic circuit 22-1. In this manner, a signal can be generated in which the logic value sequentially inverts at time intervals τ1, τ2.

By causing the operation described above to be performed n the same manner by each delay circuit 10 and logic circuit 22, the last stage logic circuit 22-5 generates a signal in which the logic value sequentially inverts at time intervals τ1, τ2, τ3, τ4, τ5 according to the delay time of each delay circuit 10. Furthermore, by causing the sum of the delay amounts of each delay circuit 10 Στk (k=1, 2, ..., 5) to be less than the pulse width $T_{IN}$ of the reference signal, a jittery signal into which jitter of the prescribed pattern is repeatedly injected can be easily generated for each period of the pulse width $T_{IN}$ of the reference signal. In this case, the signal generating section 20 generates a plurality of bits of the jittery signal for each bit of the reference signal.

The plurality of delay circuits 10 are disposed to correspond to the plurality of bits of the jittery signal generated for each bit of the reference signal. The delay amount of each delay circuit 10 designates the duration of the corresponding bit.

In the present embodiment, as shown in FIG. 2, a jittery signal can be generated in which the waveform in which the bit duration sequentially changes in an order of $\tau 1, \tau 2, \tau 3, \tau 4, \tau 5, T_{IN}-\Sigma\tau k$ (k=1, 2, ..., 5) is repeated for each period of the pulse width $T_{IN}$ of the reference signal. Because the jitter is generated in the jitter injection circuit 100 of the present embodiment without dynamically changing the delay times of the delay circuits 10, high frequency jitter can be generated easily.

Because the jitter pattern is repeated for each pulse width $T_{IN}$ of the reference signal in the jitter injection circuit 100 of the present embodiment, the frequency of the generated jitter is substantially equal to an integer multiple of the reference signal bit rate ($1/T_{IN}$). Furthermore, in a case where the delay time of each logic circuit 22 cannot be ignored, the delay setting section 30 may set the delay time of the delay circuit 10 in a stage immediately after the logic circuit 22 in a manner to cancel the delay time of each logic circuit 22.

Figure 3:
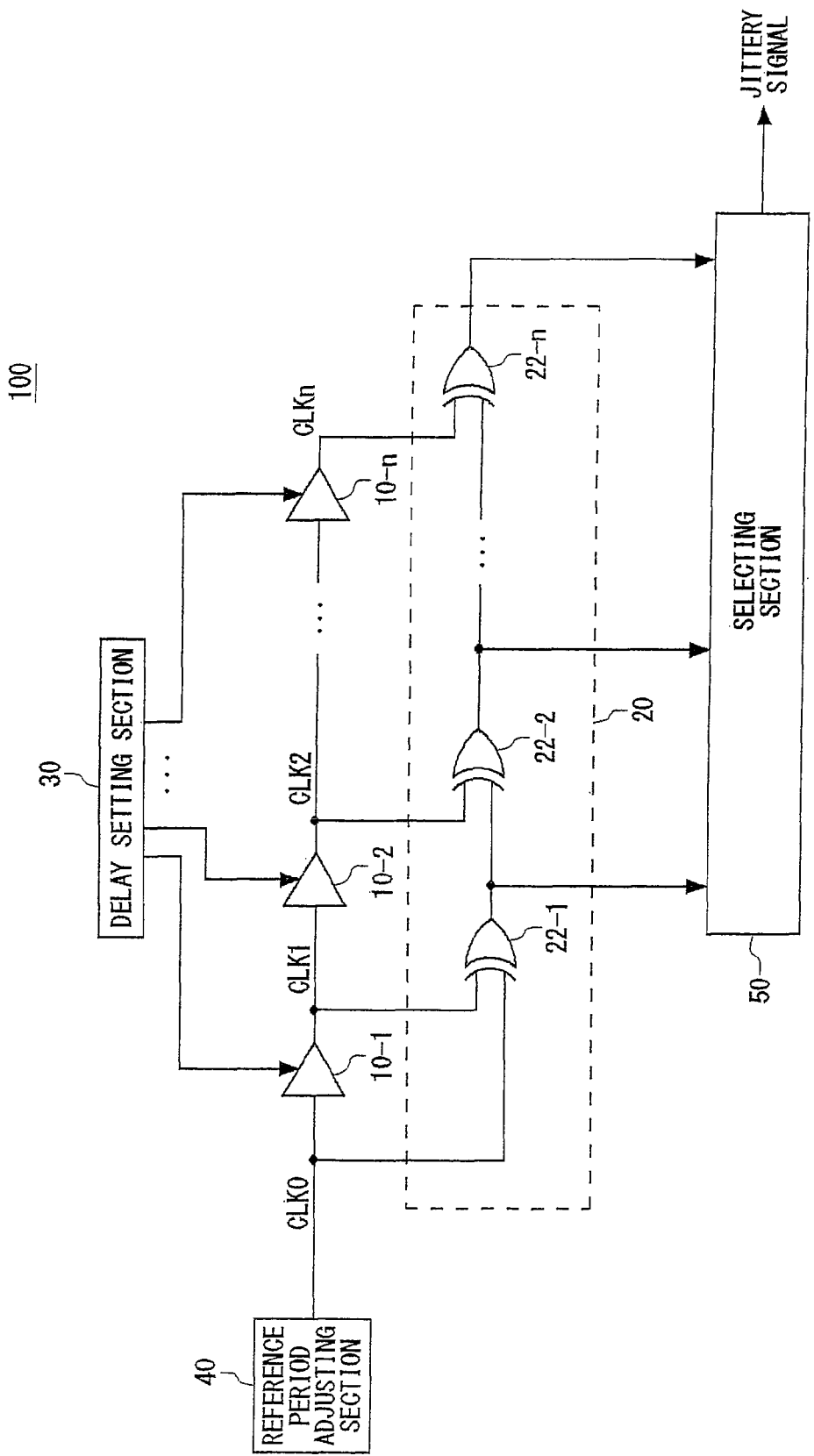
FIG. 3 shows another exemplary configuration of the jitter injection circuit 100.

FIG. 3 shows an exemplary configuration of another jitter injection circuit 100. The jitter injection circuit 100 of the present embodiment is further provided with a reference period control section 40 and a selecting section 50 in addition to the configuration of the jitter injection circuit 100 described in relation to FIG. 1. Furthermore, the jitter injection circuit 100 may have a configuration in which either the reference period control section 40 or the selecting section 50 is not provided.

As described in relation to FIG. 2, it is desirable that the sum of the delay amounts of the plurality of delay circuits 10 be less than the pulse width of the reference signal CLK0. In this case, the period of the jitter injected into the jittery signal is equal to the pulse width of the reference signal CLK0 or a fraction thereof having a numerator of one. The reference period control section 40 may control the pulse width of the reference signal CLK0 provided to the plurality of delay circuits 10 according to the period of the jitter to be injected into the jittery signal.

As further described in relation to FIG. 2, the average period (average bit duration) of the jittery signal is a value calculated by dividing the pulse width of the reference signal by a value obtained by adding one to the stage number n of the delay circuit 10. The selecting section 50 may select one of the output signals OCLKk of the plurality of logic circuits 22 according to the average period to be had by the jittery signal and may output the selected signal as the jittery signal. More specifically, the selecting section 50 may select the output signal of the logic circuit 22 at a stage number obtained by subtracting one from the value calculated by dividing the pulse width $T_{IN}$ of the reference signal by the average period $T_{OUT}$ of the jittery signal.

Figure 4:
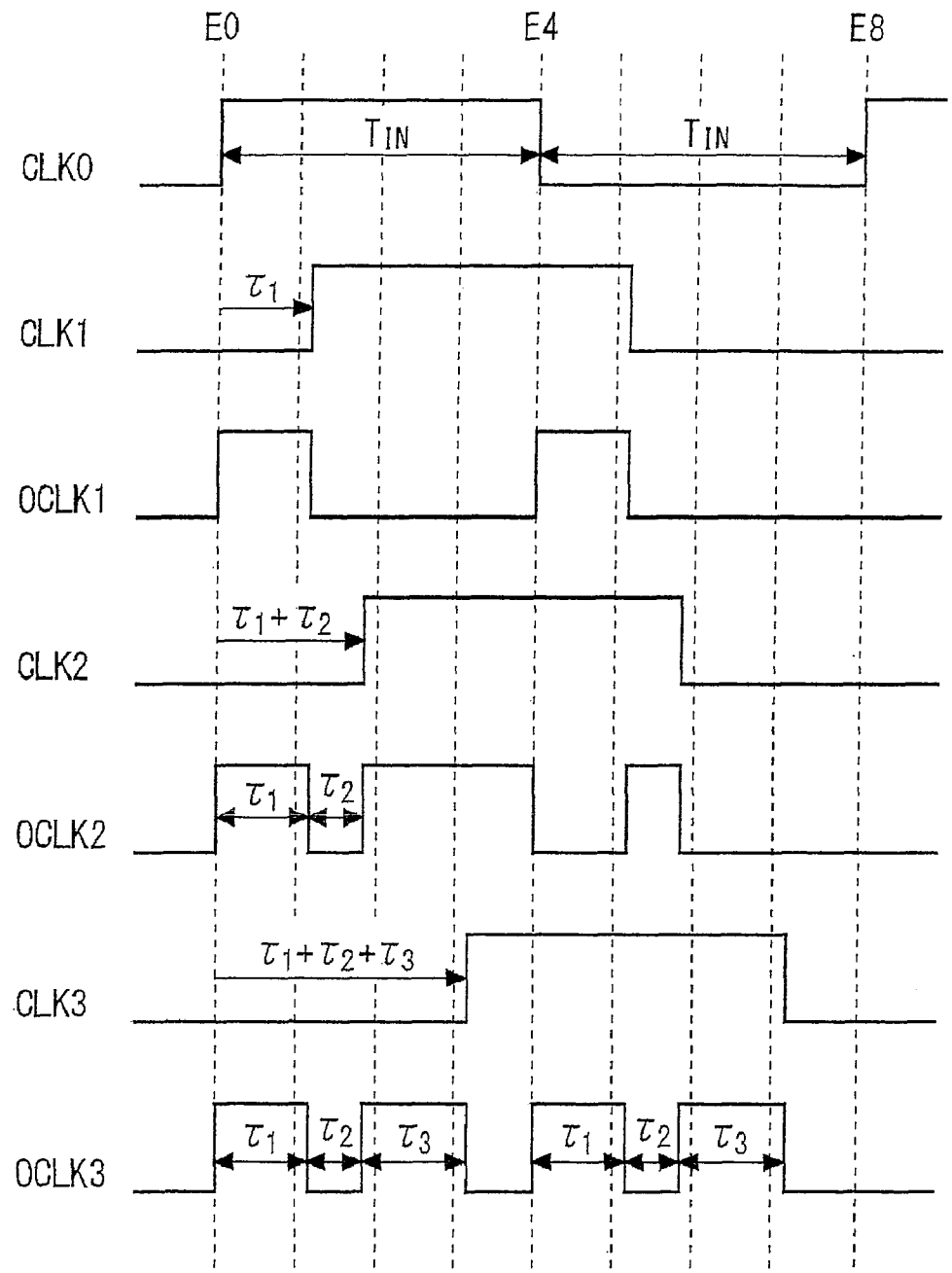
FIG. 4 is a timing chart showing an exemplary operation of the jitter injection circuit 100 shown in FIG. 3.

FIG. 4 is a timing chart showing an exemplary operation of the jitter injection circuit 100 shown in FIG. 3. The jitter injection circuit 100 of the present embodiment has an average period of $T_{IN}/4$ and generates a jittery signal in which the period of the injected jitter is $T_{IN}$. The reference period control section 40 controls the reference signal such that the period (pulse width) of the reference signal CLK0 becomes $T_{IN}$.

Furthermore, because $(T_{IN}/T_{OUT})-1=3$, the selecting section 50 selects the output signal of the third stage logic circuit 22. The delay setting section 30 sets, for each delay circuit 10 from the first to third stages respectively, delay amounts $\tau 1, \tau 2, \tau 3$ calculated by adding or subtracting to or from the average period $T_{IN}/4$ of the jittery signal, jitter values according to the jitter waveform to be injected to each delay circuit 10 from the first to third stages. The jitter values according to the jitter waveform to be injected may be values obtained by sequentially sampling the jitter waveform having a period of $T_{IN}$ with a clock having a period of $T_{IN}/(n+1)$ (where n is the stage number of the delay circuit 10). By using such settings, a jittery signal is generated having an average period of $T_{IN}/(n+1)$ and in which the period of the injected jitter is $T_{IN}$.

Figure 5:
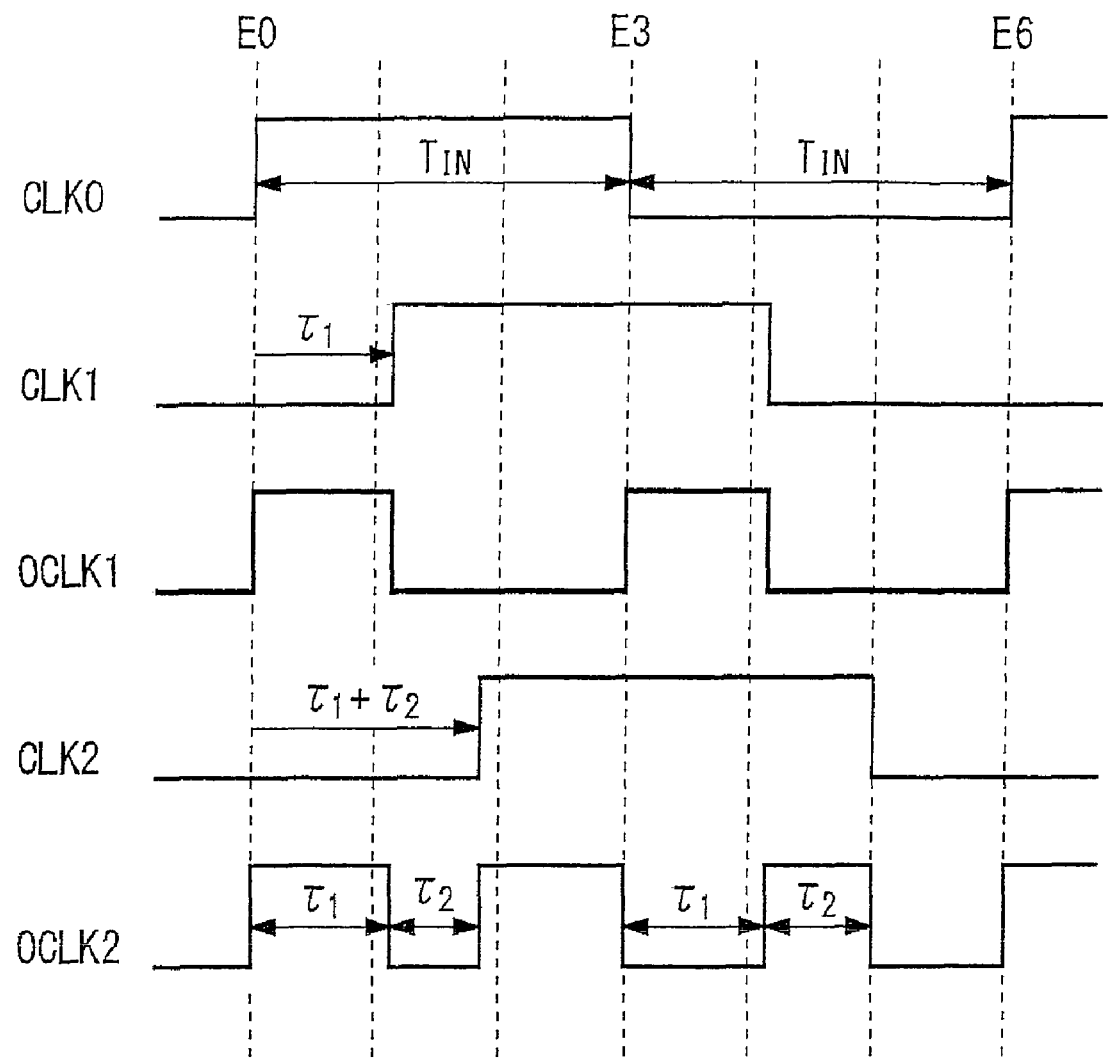
FIG. 5 is a timing chart showing another exemplary operation of the jitter injection circuit 100 shown in FIG. 3.

FIG. 5 is a timing chart showing another exemplary operation of the jitter injection circuit 100 shown in FIG. 3. In the example described in relation to FIG. 4, the selecting section 50 selects the output signal of a logic circuit 22 at an odd numbered stage. The selecting section 50 of the present embodiment selects the output signal of a logic circuit 22 at an even numbered stage.

In such a case, the waveform of the jittery signal corresponding to areas before and after the edge of the reference signal CLK0 is inverted. In the example shown in FIG. 5, the waveform of the jittery signal is inverted in the period from E0 to E3 in relation to the period E3 to E6. The selecting section 50 may select the output signal of a logic circuit 22 at an even numbered stage or the exclusive OR circuit at an odd numbered stage depending on the intended use of the jittery signal.

Figure 6:
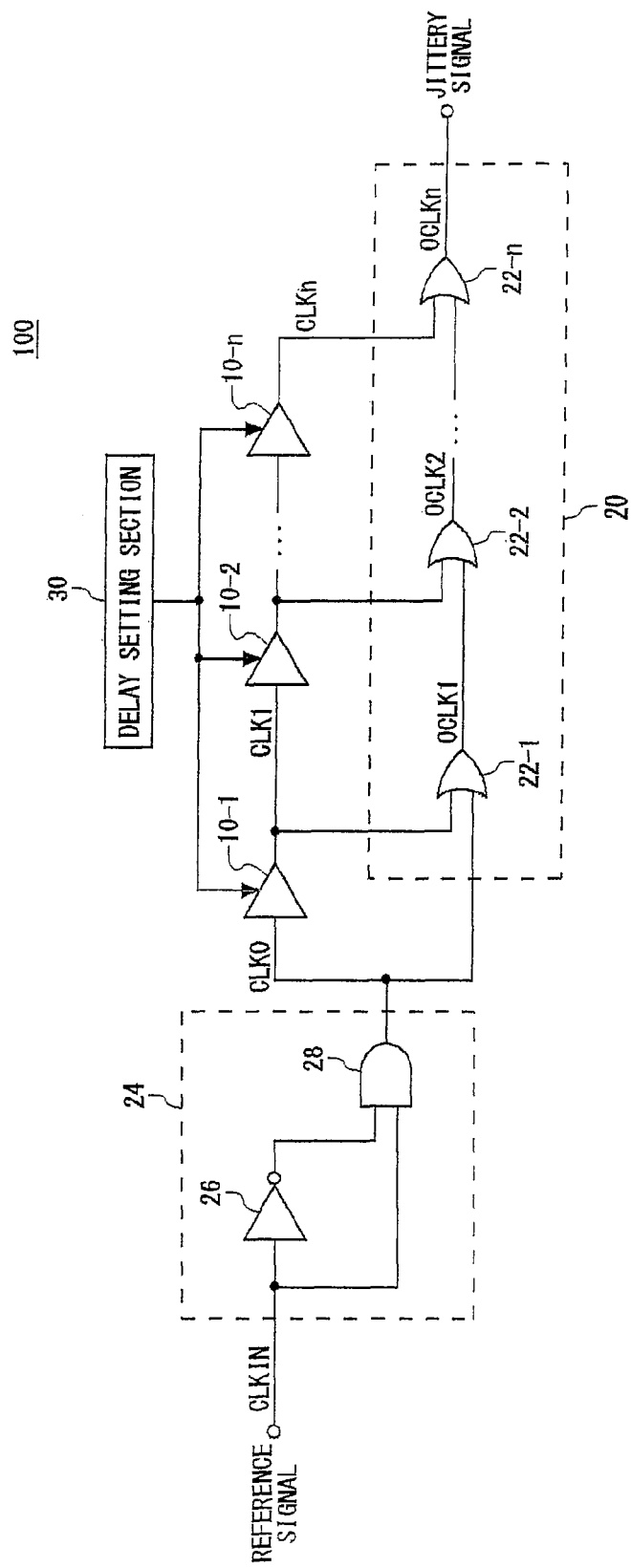
FIG. 6 shows another exemplary configuration of the jitter injection circuit 100.

FIG. 6 shows another exemplary configuration of the jitter injection circuit 100. The jitter injection circuit 100 according to the present embodiment is further provided with a pulse generating section 24 in addition to the configuration of any one of the jitter injection circuits 100 described in relation to FIGS. 1 to 5. FIG. 6 shows an example in which the pulse generating section 24 is added to the configuration of the jitter injection circuit 100 shown in FIG. 1.

The pulse generating section 24 receives the reference signal $CLK_{IN}$, generates a pulse having a prescribed pulse width for each rising edge of the reference signal $CLK_{IN}$, and outputs the generated pulse as the reference signal CLK0. The pulse generating section 24 supplies the reference signal CLK0 to the first stage delay circuit 10-1 and the first stage logic circuit 22-1.

The delay circuits 10 and logic circuits 22 from the second stage onward may be the same as those of the jitter injection circuits 100 described in relation to FIGS. 1 to 5. Furthermore, the logic circuits 22 of the present embodiment may be OR circuits, as shown in FIG. 6.

Figure 7:
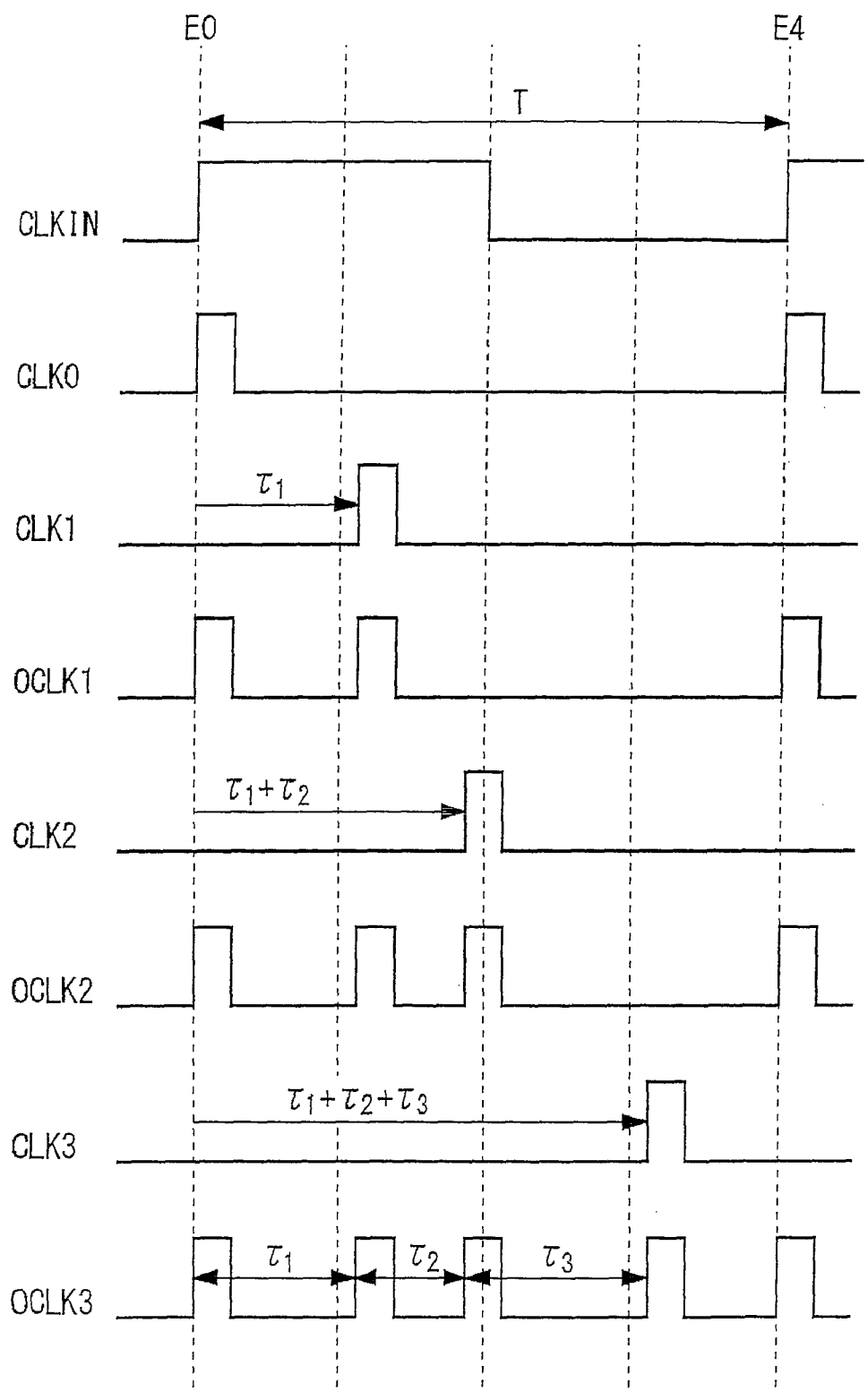
FIG. 7 is a timing chart showing an exemplary operation of the jitter injection circuit 100 shown in FIG. 6.

FIG. 7 is a timing chart showing an exemplary operation of the jitter injection circuit 100 shown in FIG. 6. As described above, the pulse generating section 24 outputs the pulse having the prescribed pulse width for each rising edge of the reference signal $CLK_{IN}$. It is desirable that the pulse width be less than any one of the delay amounts $\tau 1, \tau 2, \ldots$ set for the plurality of delay circuits 10.

The first stage delay circuit 10 receives the pulse output by the pulse generating section 24, delays the received pulse by the delay amount $\tau 1$, and outputs the thus delayed pulse. The first stage logic circuit 22 outputs the OR of the signal output by the pulse generating section 24 and the signal output by the first stage delay circuit 10. In other words, the first stage logic circuit 22 outputs a signal that includes the pulse output by the pulse generating section 24 and the pulse output by the first stage delay circuit 10.

The delay circuits 10 from the second stage onward each sequentially delay the signal output by the delay circuit 10 at a stage immediately prior thereto. The logic circuits 22 from the second stage onward each output the OR of the signal output by the corresponding delay circuit 10 and the signal output by the logic circuit 22 at a stage immediately prior thereto. In this manner, a jittery signal can be generated in which the pulses are arranged at pulse intervals according to the delay amounts of the plurality of delay circuits 10, as shown in FIG. 7. Therefore, period jitter can be injected into each period (each pulse interval) of the jittery signal because the delay setting section 30 sets in advance for each delay circuit 10 the delay amount according to the period jitter waveform to be injected.

The present embodiment describes a case in which the logic circuits 22 are OR circuits. The logic circuits 22 may be exclusive OR circuits in the same manner as those in the jitter injection circuits 100 described in relation to FIGS. 1 to 5. In such a case, the jitter injection circuit 100 may be further provided with an input switching section that switches whether the reference signal or the pulse generated by the pulse generating section 24 is input into the first stage delay circuit 10 and the first stage logic circuit 22. By using such a configuration, a selection can be made as to whether the jitter injection circuit 100 is made to operate as described in relation to FIGS. 1 to 5 or made to operate as described in relation to FIGS. 6 and 7.

In the jitter injection circuit 100 described in relation to FIGS. 1 to 7, the delay setting section 30 may set delay amounts greater than a predetermined reference value for the delay circuits 10 in a first half of the stages and set delay amounts less than the predetermined reference value for the delay circuits 10 in a latter half of the stages. More specifically, the delay setting section 30 may set a delay amount for the delay circuits 10 in the first half of the stages that is obtained by adding a prescribed unit value to the reference value. The delay setting section 30 may set a delay amount for the delay circuits 10 in the latter half of the stages that is obtained by subtracting a prescribed unit value from the reference value.

The delay setting section may use as the reference value an average period (an average value of bit durations) to be contained in the jittery signal. With such a configuration, a jittery signal into which triangular wave jitter is injected can be generated easily. The jitter injection circuit 100 may generate both delay amounts greater than the reference value and delay amounts less than the reference value as described above by combining the delay circuit that generates the reference value delay amount and a buffer that generates the delay amount of the prescribed unit value.

Figure 8:
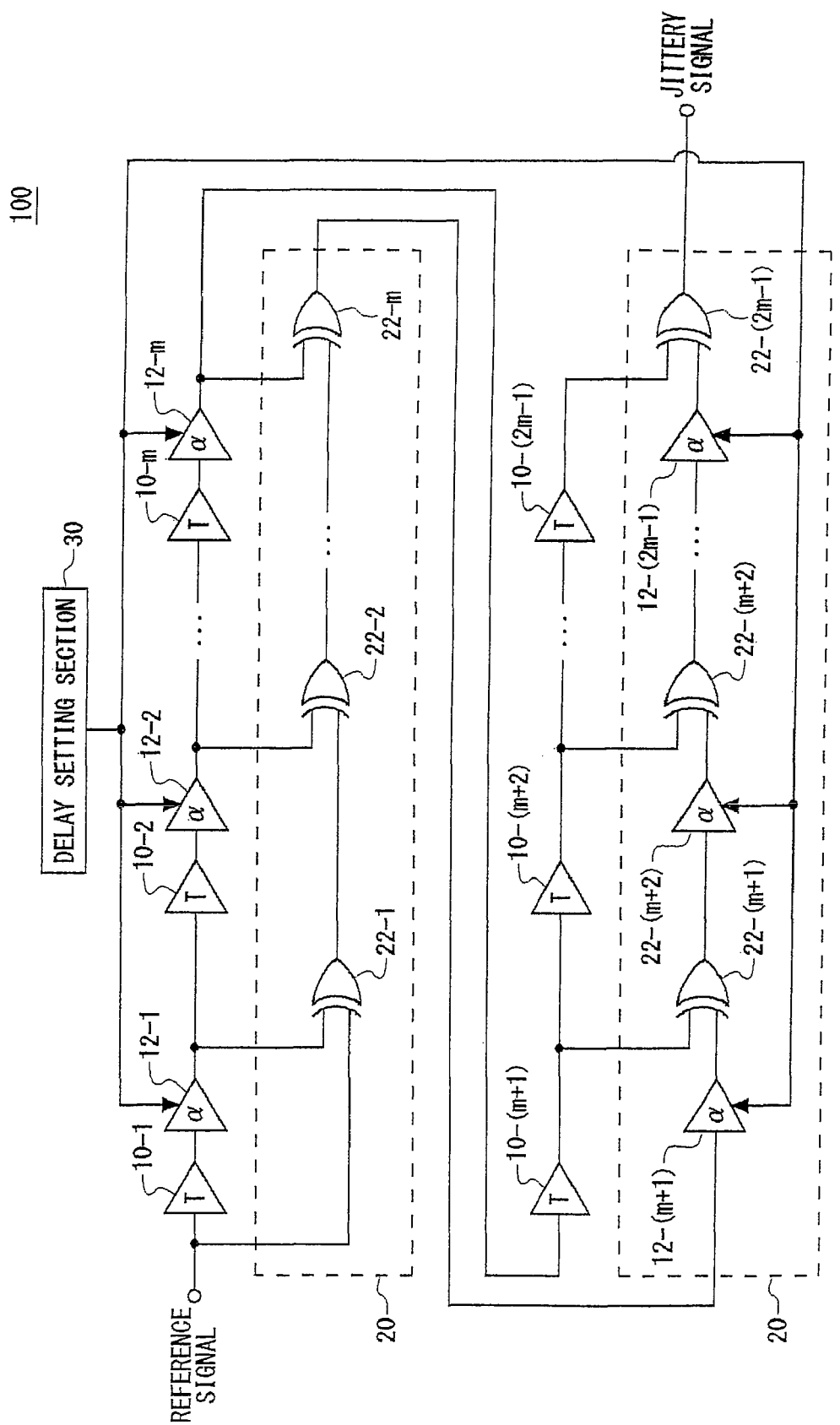
FIG. 8 shows another exemplary configuration of the jitter injection circuit 100.

FIG. 8 shows another exemplary configuration of the jitter injection circuit 100. The jitter injection circuit 100 of the present embodiment generates the jittery signal into which triangular wave timing jitter is injected, as described above. The timing jitter may refer to a variation in the actual edge timing instead of the ideal edge timing.

The jitter injection circuit 100 of the present embodiment includes buffers (12-1 to 12-$m$) in a first half of the stages and buffers (12-($m$+1) to 12-(2m−1)) in the latter half of the stages (where m is an integer greater than or equal to two) in addition to the configuration of any one of the jitter injection circuits 100 described in relation to FIGS. 1 to 7. FIG. 8 shows an example in which the plurality of buffers 12 are added to the configuration of the jitter injection circuit 100 shown in FIG. 1.

The jitter injection circuit 100 of the present embodiment is provided with an odd number (2m−1) of delay circuits 10, and a delay amount that is substantially equal to the average period of the jittery signal is set for each delay circuit 10. The delay setting section 30, according to a common control signal, adjusts in advance the delay amounts of the buffers 12 in the first half of the stages and the buffers 12 in the latter half of the stages to have substantially the same delay amounts.

The buffers 12 in the first half of the stages are disposed to correspond one-to-one with the delay circuits 10 in the first half of the stages. The buffers 12 and the delay circuits 10 in the first half of the stages may refer to the buffers 12 and delay circuits 10 from the first stage to the m-th stage. Each buffer 12 in the in the first half of the stages further delays the output signal of the corresponding delay circuit 10 by a delay amount a according to the designated unit value and supplies the thus delayed signal to the delay circuit 10 at a stage immediately thereafter. In this way, a delay can be generated in each of the delay circuits 10 in the first half of the stages that is equivalent to setting delay amounts obtained by adding the unit values to the predetermined reference value.

The buffers 12 in the latter half of the stages are disposed to correspond one-to-one with the logic circuits 22 in the latter half of the stages. The buffers 12 and the logic circuits 22 in the latter half of the stages may refer to the buffers 12 and the logic circuits 22 from the (m+1)-th stage to the (2m$^{-1}$)-th stage. Each buffer 12 in the latter half of the stages further delays the input signal of the corresponding logic circuit 22 by a delay amount $\alpha$ according to the designated unit value. In this way, a delay can be generated in each of the delay circuits 10 in the latter half of the stages that is relative and equivalent to setting delay amounts obtained by subtracting the unit values from the predetermined reference value.

Figure 9:
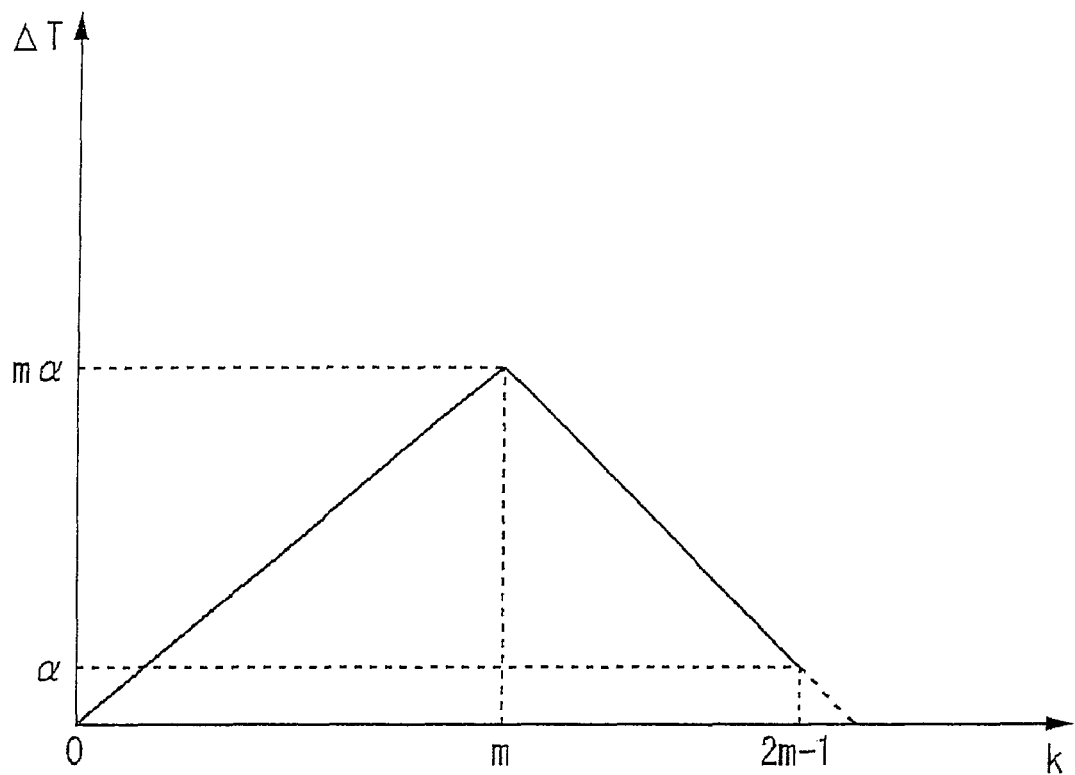
FIG. 9 shows a value of timing jitter generated at each stage by the jitter injection circuit 100 shown in FIG. 8.

FIG. 9 shows values of timing jitter generated at each stage by the jitter injection circuit 100 shown in FIG. 8. The phase of the signal transmitted by the delay circuits 10 and the buffers 12 in the first half of the stages is delayed, in relation to the edge timing $kT_{out}$ of the ideal jittery signal that does not contain jitter, by the unit value $\alpha$ every time the signal passes through one stage of the delay circuits 10 and buffers 12. Therefore, the timing jitter generated in the first half of the stages increases by $\alpha$ for at each stage, as shown in FIG. 9.

In the latter half of the stages, the delay amount of the unit value $\alpha$ is sequentially applied to the signal transmitted by the logic circuits 22 and the buffers 12 in the latter half of the stages. Therefore, the timing jitter generated in the latter half of the stages decreases by $\alpha$ at each stage, as shown in FIG. 9. In the manner described above, by using the jitter injection circuit 100 shown in FIG. 8, the triangular wave timing jitter can easily be generated.

Figure 10:
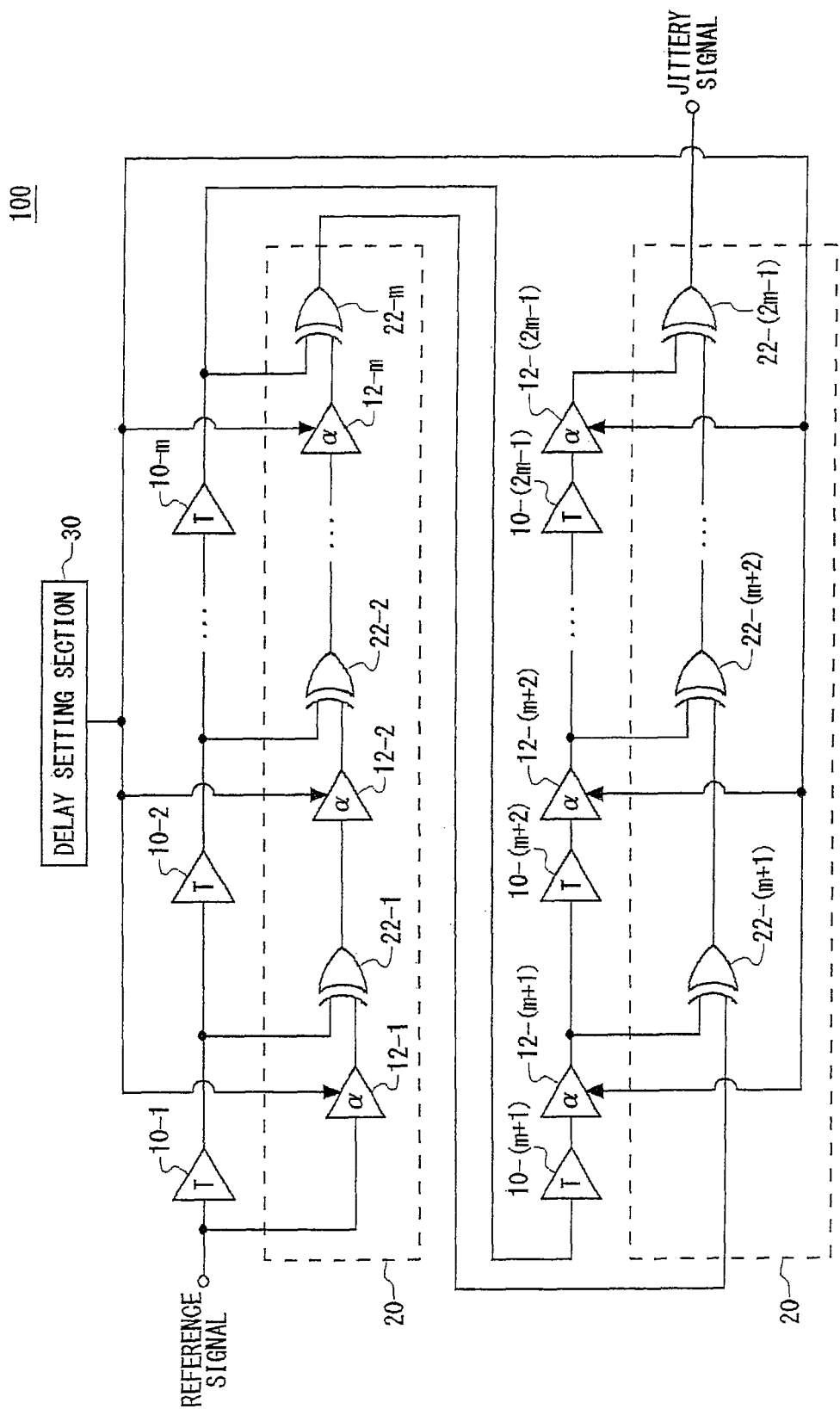
FIG. 10 shows another exemplary configuration of the jitter injection circuit 100.

FIG. 10 shows another exemplary configuration of the jitter injection circuit 100. The jitter injection circuit 100 of the present embodiment has a configuration different from that of the jitter injection circuit 100 shown in FIG. 8 in that the buffers 12 in the first half of the stages are disposed at the input ends of the logic circuits 22 in the first half of the stages and the buffers 12 in the latter half of the stages are disposed at the output ends of the delay circuits 10 in the latter half of the stages. Other portions of the configuration may be the same as those of the jitter injection circuit 100 shown in FIG. 8.

In other words, the jitter injection circuit 100 of the present embodiment is a circuit that is equivalent to a circuit in which delay amounts that are less than a predetermined reference value are set for the delay circuits 10 in the first half of the stages and delay amounts that are greater than the predetermined reference value are set for the delay circuits 10 in the latter half of the stages. The waveform of the timing jitter generated by the jitter injection circuit 100 is a waveform that is an inverse of the jitter waveform shown in FIG. 9.

The buffers 12 in the first half of the stages are disposed to correspond one-to-one with the logic circuits 22 in the first half of the stages. Each buffer 12 in the first half of the stages delays the input signal of the corresponding logic circuit 22 by the delay amount $\alpha$ dependent on the designated unit values. By doing this, a delay can be generated in each of the delay circuits 10 in the first half of the stages that is relative and equivalent to setting delay amounts obtained by subtracting the unit values from the predetermined reference value.

The buffers 12 in the latter half of the stages are disposed to correspond one-to-one with the delay circuits 10 in the latter half of the stages. Each buffer 12 in the latter half of the stages delays the output signal of the corresponding delay circuit 10 by the delay amount α dependent on the designated unit values and supplies the thus delayed signal to the delay circuit 10 at a stage immediately thereafter. By doing this, a delay can be generated in each of the delay circuits 10 in the latter half of the stages that is equivalent to setting delay amounts obtained by adding the unit values to the predetermined reference value. By using the configuration described above, triangular wave timing jitter can be generated easily.

Figure 11:
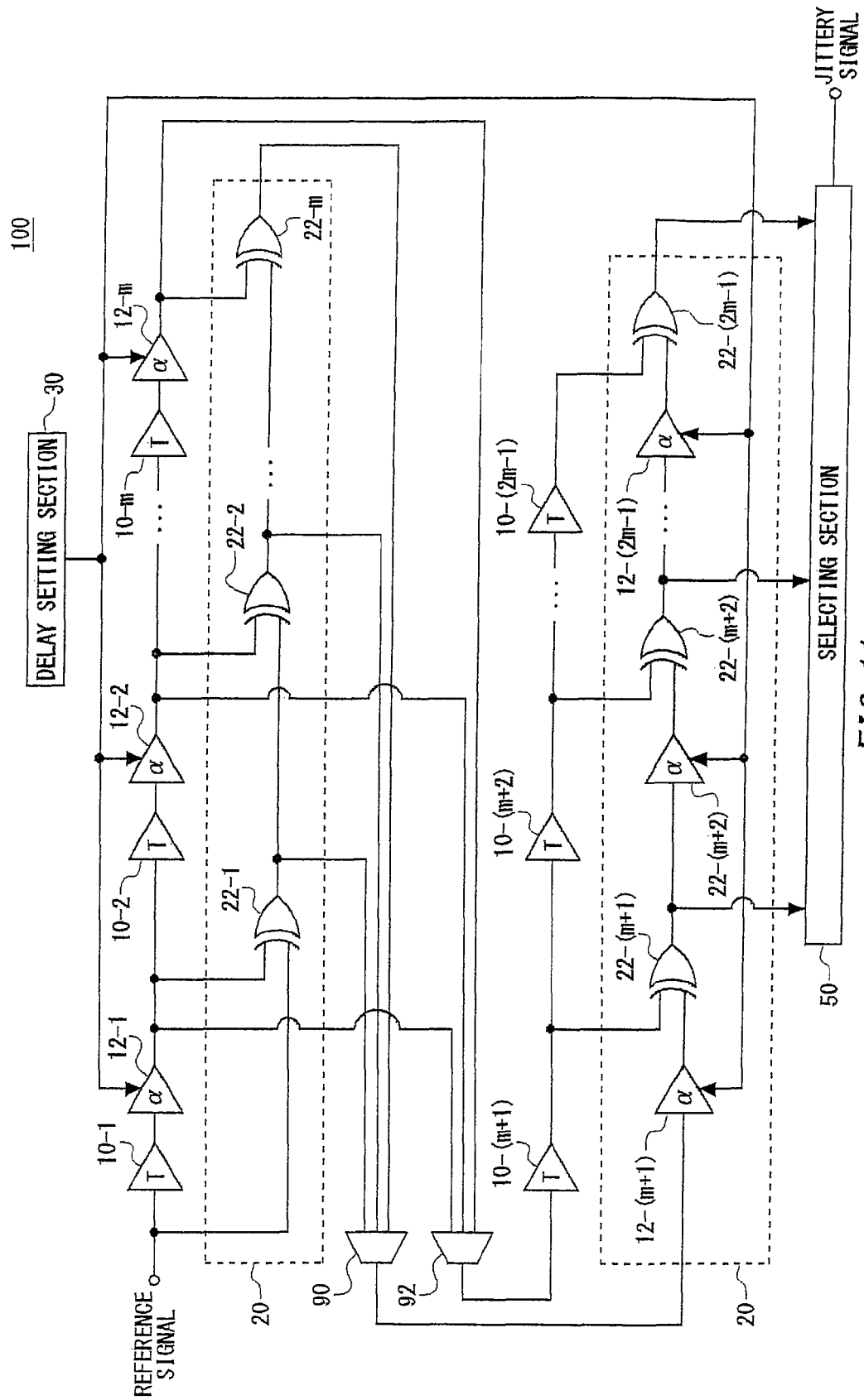
FIG. 11 shows another exemplary configuration of the jitter injection circuit 100.

FIG. 11 shows another exemplary configuration of the jitter injection circuit 100. The jitter injection circuit 100 of the present embodiment is further provided with the selecting section 50 and multiplexers 90, 92 in addition to the configuration of the jitter injection circuit 100 shown in FIG. 8 or FIG. 10. FIG. 11 shows a configuration in which the selecting section 50 and the multiplexers 90, 92 are added to the jitter injection circuit 100 shown in FIG. 8.

The multiplexer 90 selects one of the output signals of the logic circuits 22 in the first half of the stages and supplies the selected signal to the buffers 12-(m+1) in the latter half of the stages. The multiplexer 92 selects one of the output signals of the buffers 12 in the first half of the stages and supplies the selected signal to the delay circuits 10-(m+1) in the latter half of the stages. The multiplexer 90 and the multiplexer 92 select output signals from a logic circuit 22 and a buffer 12 that are at the same stage.

The selecting section 50 selects one of the output signals of the logic circuits 22 in the latter half of the stages and outputs the selected signal as the jittery signal. The selecting section 50 may determine which stage's signal in the latter half of the stages is selected according to which stage's signal in the first half of the stages is selected by the multiplexer 90 and the multiplexer 92. More specifically, when the multiplexer 90 and the multiplexer 92 select a p-th stage signal in the first half of the stages, the selecting section 50 may select the (p−1)-th stage signal in the latter half of the stages.

Figure 12:
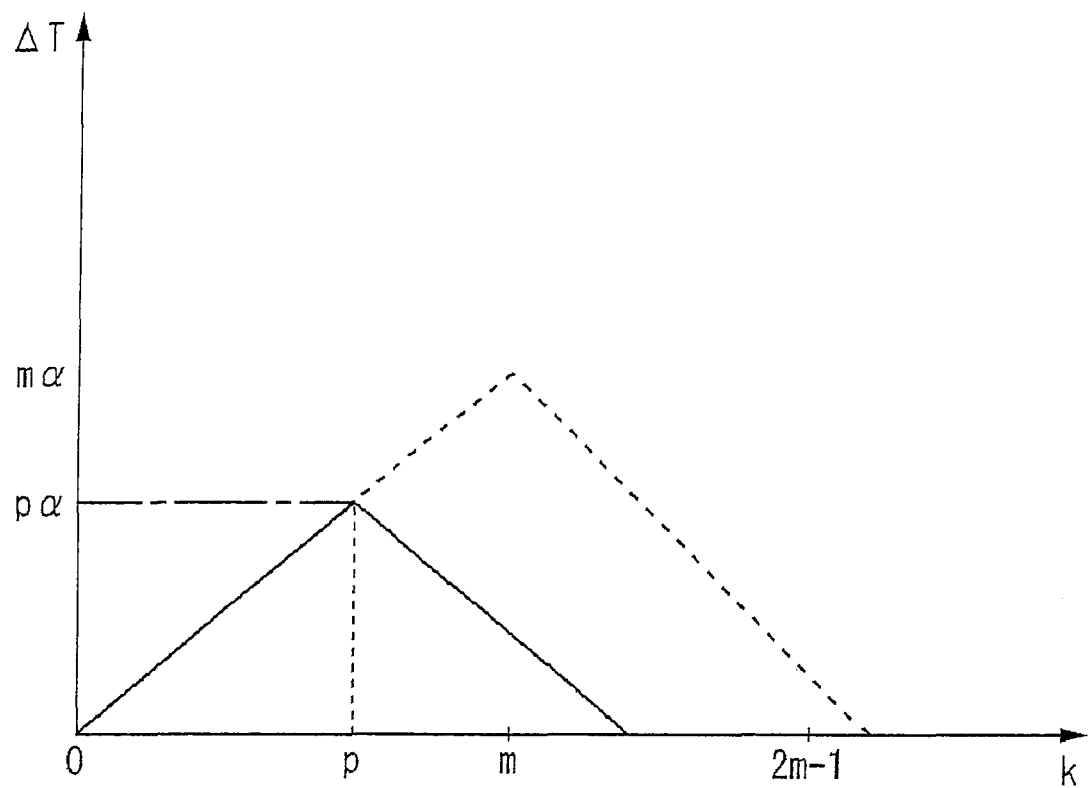
FIG. 12 shows a value of timing jitter generated at each stage by the jitter injection circuit 100 shown in FIG. 11.

FIG. 12 shows a value of the timing jitter generated at each stage by the jitter injection circuit 100 shown in FIG. 11. When the multiplexer 90 and the multiplexer 92 select a p-th stage signal in the first half of the stages, a first half portion of the triangular wave jitter shown in FIG. 12 is generated by the circuits in the stages of the first half. The selecting section 50 then selects the (p−1)-th stage signal in the latter half of the stages, which results in a latter half portion of the triangular wave jitter shown in FIG. 12 being generated by the circuits in the stages of the latter half.

By using the configuration described above, the period and amplitude of the triangular wave jitter can be adjusted. When the jitter injection circuit 100 adjusts the period of the triangular wave jitter using the selecting section 50 or the like, the jitter injection circuit 100 may be further provided with the reference period control section 40 that adjusts the pulse width of the reference signal according to the jitter period.

Figure 13:
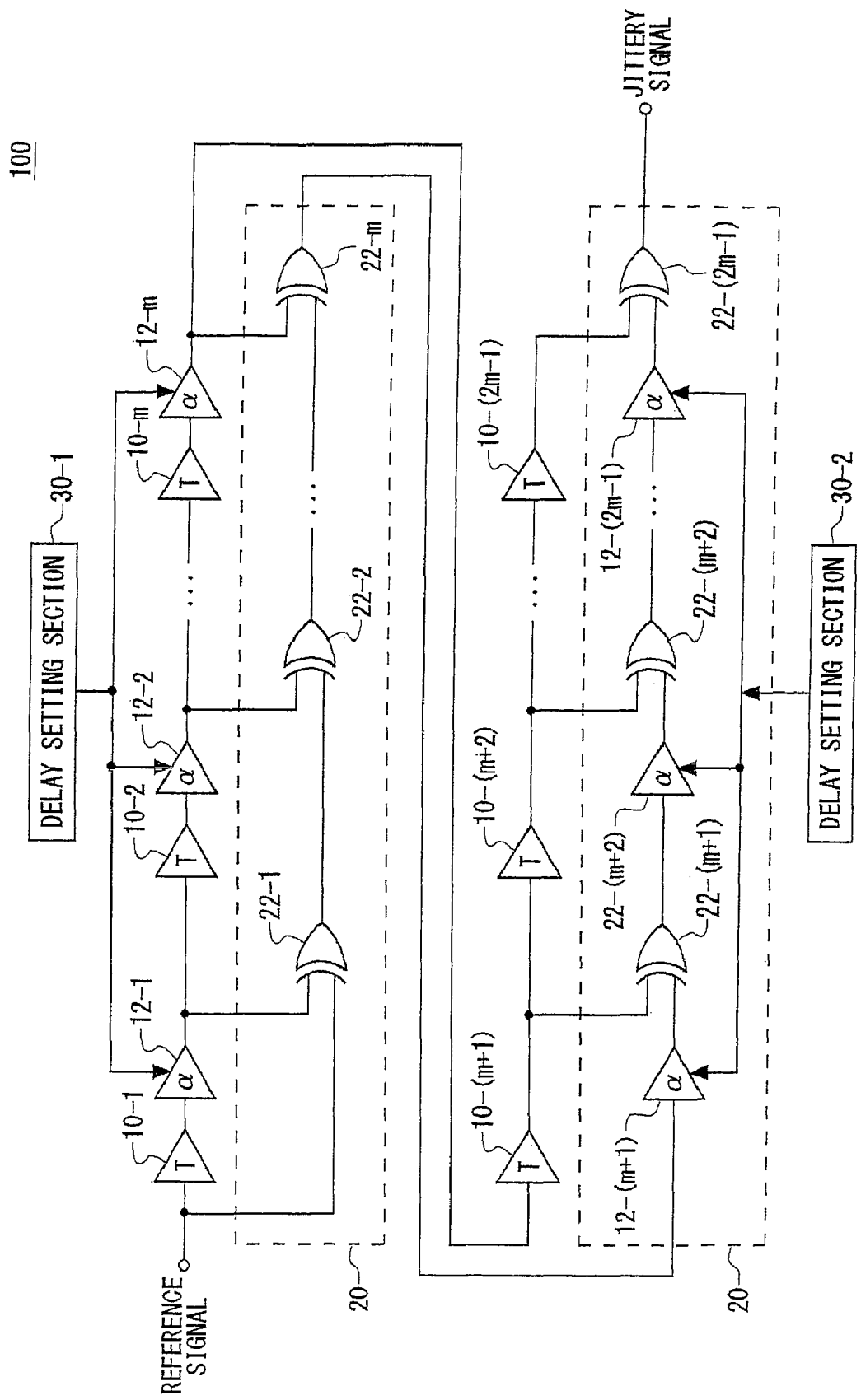
FIG. 13 shows another exemplary configuration of the jitter injection circuit 100.

FIG. 13 shows another exemplary configuration of the jitter injection circuit 100. The jitter injection circuit 100 of the present embodiment is different from the configuration of any one of the jitter injection circuits 100 describe in relation to FIGS. 8 to 12 in that the jitter injection circuit 100 of the present embodiment is provided with two circuitries of delay setting sections 30. Other portions of the configuration may be the same of those of any one of the jitter injection circuits 100 describe in relation to FIGS. 8 to 12.

A first delay setting section 30 sets delay amounts for the buffers 12 in the first half of the stages. A second delay setting section 30 sets delay amounts for the buffers 12 in the latter half of the stages. In other words, in the jitter injection circuit 100 of the present embodiment, the delay amounts of the buffers 12 in the first half of the stages can be different from the delay amounts of the buffers 12 in the latter half of the stages.

For example, the first delay setting section 30 may set values obtained by adding the delay amounts in the logic circuits 22 to the unit values α to be the delay amounts of the buffers 12 in the first half of the stages. The second delay setting section 30 may set values obtained by subtracting the delay amounts in the logic circuits 22 from the unit values α to be the delay amounts of the buffers 12 in the latter half of the stages. Through such a configuration, the desired jitter can be accurately generated because the effect of the delay amounts of the logic circuits 22 is decreased.

Figure 14:
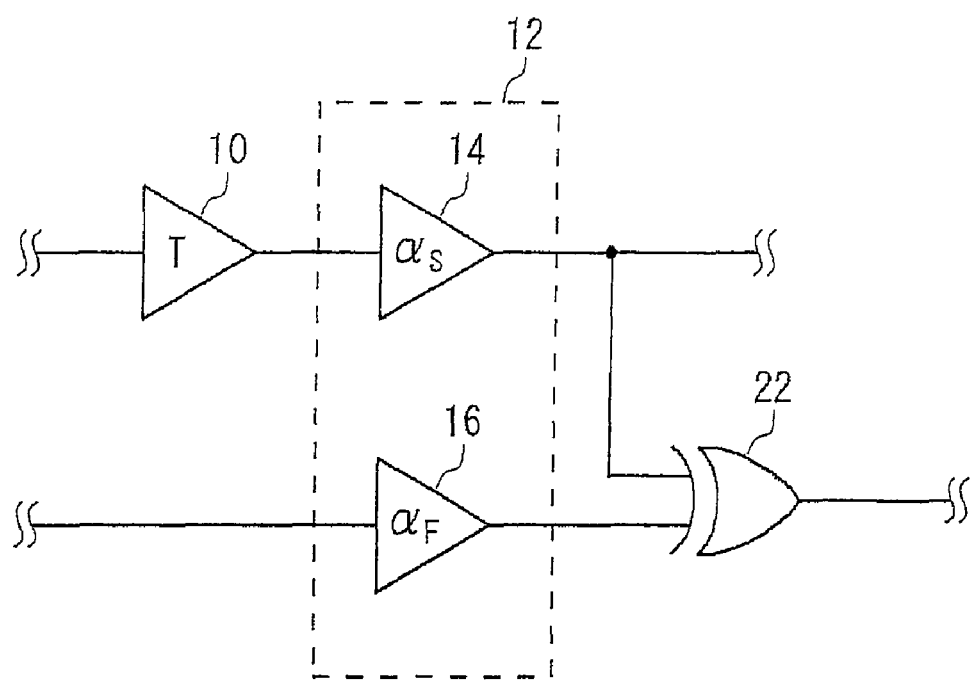
FIG. 14 shows an exemplary configuration of buffers 12 described in relation to FIGS. 8 to 13.

FIG. 14 shows an exemplary configuration of one of the buffers 12 described in relation to FIGS. 8 to 13. The buffer 12 of the present embodiment generates a very small delay using the difference between a first delay amount αS of a first delay element 14 and a second delay amount αF of the second delay element 16. More specifically, the first delay element 14 is disposed at an output end of the delay circuit 10 and the second delay element 16 is disposed at an input end of the logic circuit 22. In this way, the relative phases of the signal output by the delay circuit 10 and the signal input into the logic circuit 22 are changed according to a difference between the first delay amount αS and the second delay amount αF.

By using the configuration described above, in a case where, for example, the delay amount of the first delay amount αS is 1.0 pS and the delay amount of the second delay amount αF is 1.1 pS, a relative delay of 0.1 pS can be generated. In the buffers 12 in the first half of the stages, the first delay amount αS may be greater than the second delay amount αF and, in the buffers 12 in the latter half of the stages, the first delay amount αS may be less than the second delay amount αF.

Figure 15:
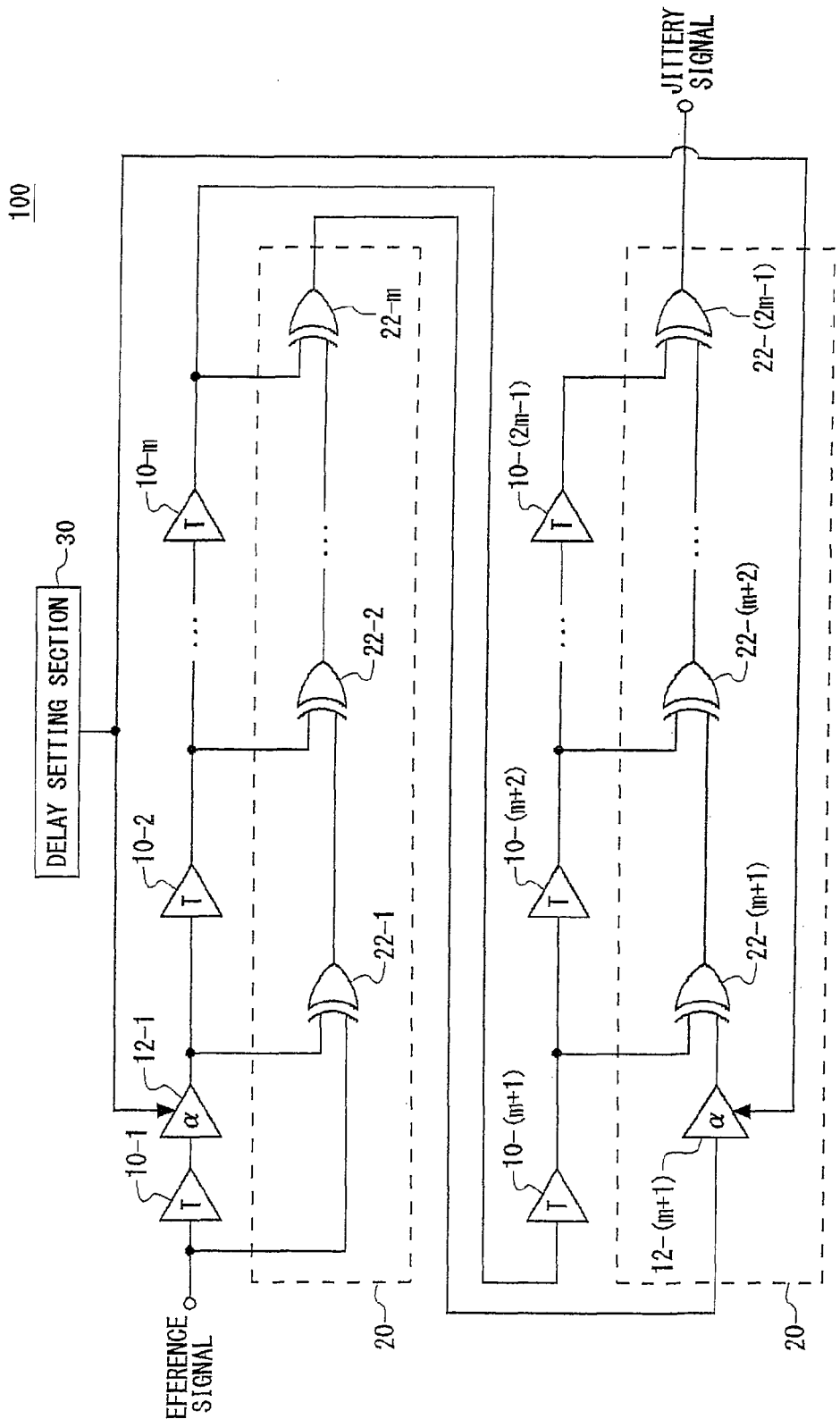
FIG. 15 shows another exemplary configuration of the jitter injection circuit 100.

FIG. 15 shows another exemplary configuration of the jitter injection circuit 100. The jitter injection circuit 100 of the present embodiment differs from the configuration of any one of the jitter injection circuits 100 describe in relation to FIGS. 8 to 14 in that the jitter injection circuit 100 of the present embodiment is provided with one buffer 12 in the first half of the stages and one buffer 12 in the latter half of the stages. Other portions of the configuration may be the same of those of any one of the jitter injection circuits 100 describe in relation to FIGS. 8 to 14.

The buffer 12-1 in the first half of the stages is disposed at a first stage in the first half of the stages. More specifically, the buffer 12-1 in the first half of the stages may be disposed at the output end of the delay circuit 10-1 or at the input end of the logic circuit 22-1.

The buffer 12-(m+1) in the latter half of the stages is disposed at a first stage in the latter half of the stages. More specifically, the buffer 12-(m+1) may be disposed at the output end of the delay circuit 10-(m+1) or at the input end of the logic circuit 22-(m+1). By using such a configuration, the jitter injection circuit 100 can generate a jittery signal into which a square wave timing jitter is injected.

The jitter injection circuits 100 described in relation to FIG. 13 or FIG. 15 may be provided with a different number of stages of delay circuits 10, buffers 12, and logic circuits 22 in the stages of the first half and the stages of the latter half.

The jitter injection circuits 100 may generate asymmetric jitter in the circuits in the first half of the stages and the circuits in the latter half of the stages.

Figure 16A:
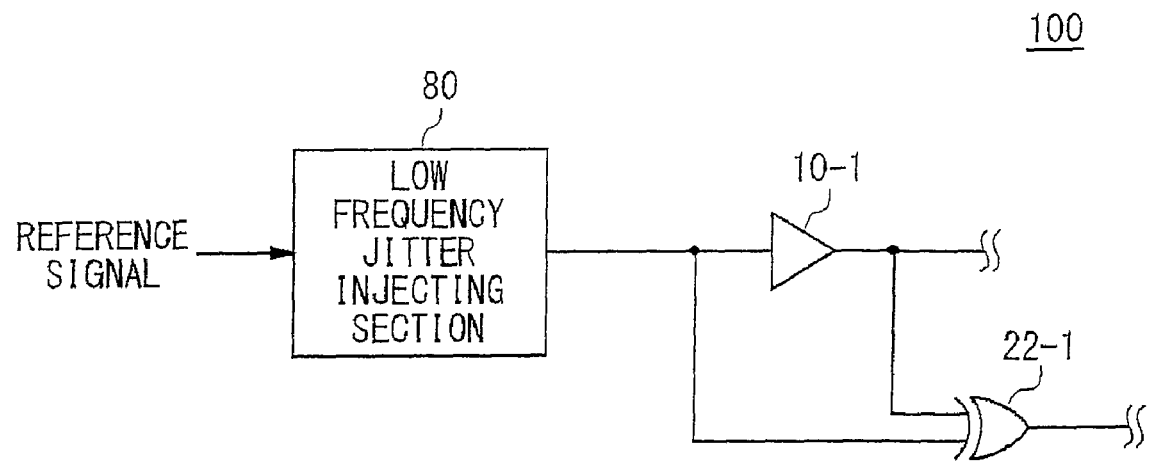
FIG. 16A shows another exemplary configuration of the jitter injection circuit 100.
Figure 16B:
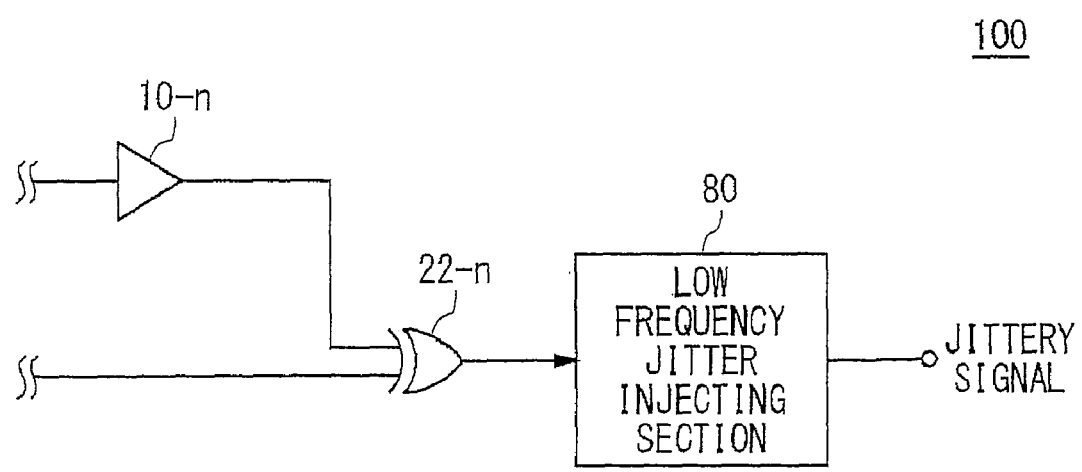
FIG. 16B shows another exemplary configuration of the jitter injection circuit 100.

FIG. 16A and FIG. 16B show other exemplary configurations of the jitter injection circuit 100. The jitter injection circuit 100 of the present embodiment is further provided with a low frequency jitter injecting section 80 in addition to the configuration of any one of the jitter injection circuits 100 described in relation to FIGS. 1 to 15. FIG. 16A and FIG. 16B show the configuration of the jitter injection circuits 100 described in relation to FIGS. 1 to 15 with a portion thereof omitted.

The low frequency jitter injecting section 80 may be disposed at a stage prior to the first stage delay circuit 10-1, as shown in FIG. 16A. In such a case, the low frequency jitter injecting section 80 injects into the reference signal jitter having a frequency lower than the frequency of the jitter generated in the plurality of delay circuits 10 and the signal generating section 20, and inputs the thus achieved signal into the first stage delay circuit 10-1. The low frequency jitter injecting section 80 may inject the low frequency jitter into the reference signal by using a variable delay circuit in which the delay amount dynamically changes, for example.

The low frequency jitter injecting section 80 may be disposed at a stage after the last stage logic circuit 22, as shown in FIG. 16B. In such a case, the low frequency jitter injecting section 80 further injects a low frequency jitter into the jittery signal output by the logic circuit 22. By using the configurations described above, jitter having a wide bandwidth can be easily generated. Furthermore, instead of providing the low frequency jitter injecting section 80, the delay setting section 30 may change the delay amount of each delay circuit 10 by a frequency that is sufficiently lower than the frequency of the reference signal.

Figure 17:
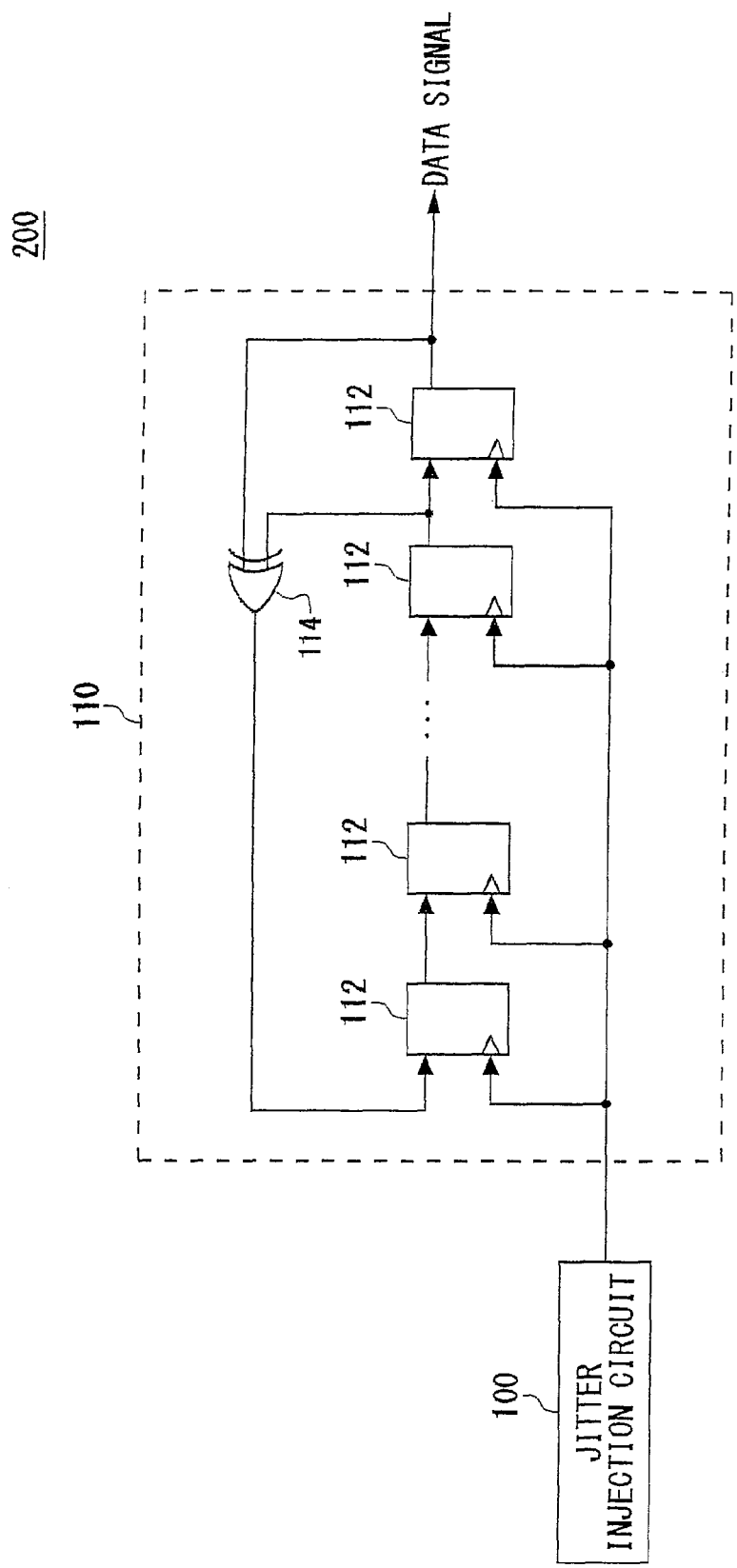
FIG. 17 shows an exemplary configuration of a data jitter injection circuit section 200 according to an embodiment.

FIG. 17 shows an exemplary configuration of a data jitter injection circuit 200 according to an embodiment. The data jitter injection circuit section 200 is a circuit that injects jitter into a data signal and is provided with the jitter injection circuit 100 and a data jitter injecting section 110.

The jitter injection circuit 100 may be the same as any one of the jitter injection circuits 100 described in relation to FIGS. 1 to 16. The data jitter injecting section 110 receives the jittery signal from the jitter injection circuit 100 and generates a data signal having a bit boundary designated by each edge timing of the jittery signal. Through such a configuration, data jitter can be injected into the data signal.

The data jitter injecting section 110 of the present embodiment is a LFSR (Linear Feedback Shift Register) that includes a plurality of flip-flops 112 and exclusive OR circuits 114. The plurality of flip-flops 112 are connected in a cascading manner and commonly receive the jittery signal. Each flip-flop 112 acquires input data according to one or both of the rising edge and the falling edge of the jittery signal and supplies the acquired data to the flip-flop 112 at a stage immediately thereafter.

The exclusive OR circuits 114 generate an exclusive OR of the output signals from two of the flip-flops 112 selected according to a generator polynomial of the LFSR and supply the exclusive OR to the first stage flip-flop 112. By using such a configuration, PRBS (Pseudo-Random Binary Sequence) data into which jitter is injected can be generated.

Figure 18:
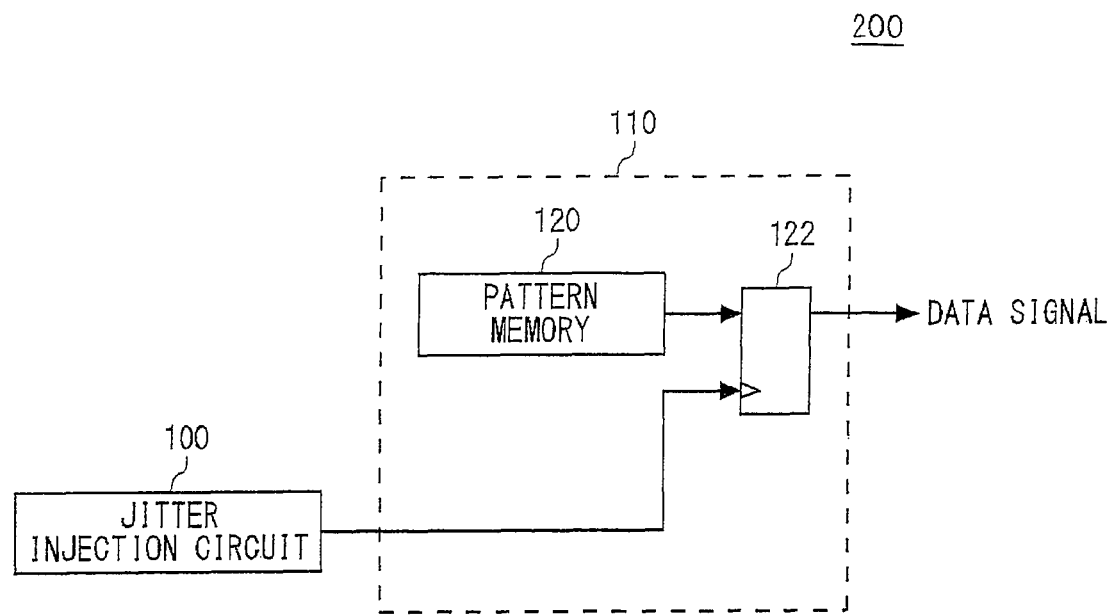
FIG. 18 shows another exemplary configuration of the data jitter injecting section 110.

FIG. 18 shows another exemplary configuration of the data jitter injecting section 110. The data jitter injecting section 110 of the present embodiment includes a pattern memory 120 and a flip-flop 122. The pattern memory 120 stores thereon in advance a logic pattern to be included in the data signal.

The flip-flop 122 acquires the logic pattern stored in the pattern memory 120 according to one or both of the rising edge and the falling edge of the jittery signal supplied from the jitter injection circuit 100 and outputs the acquired logic pattern. By using such a configuration, the jitter can be injected into a data signal having any arbitrary logic value pattern.

Instead of the configurations shown in FIGS. 17 and 18, the data signal into which the jitter is injected can be generated using any one of the jitter injection circuits 100 described in relation to FIGS. 1 to 7.

Figure 19:
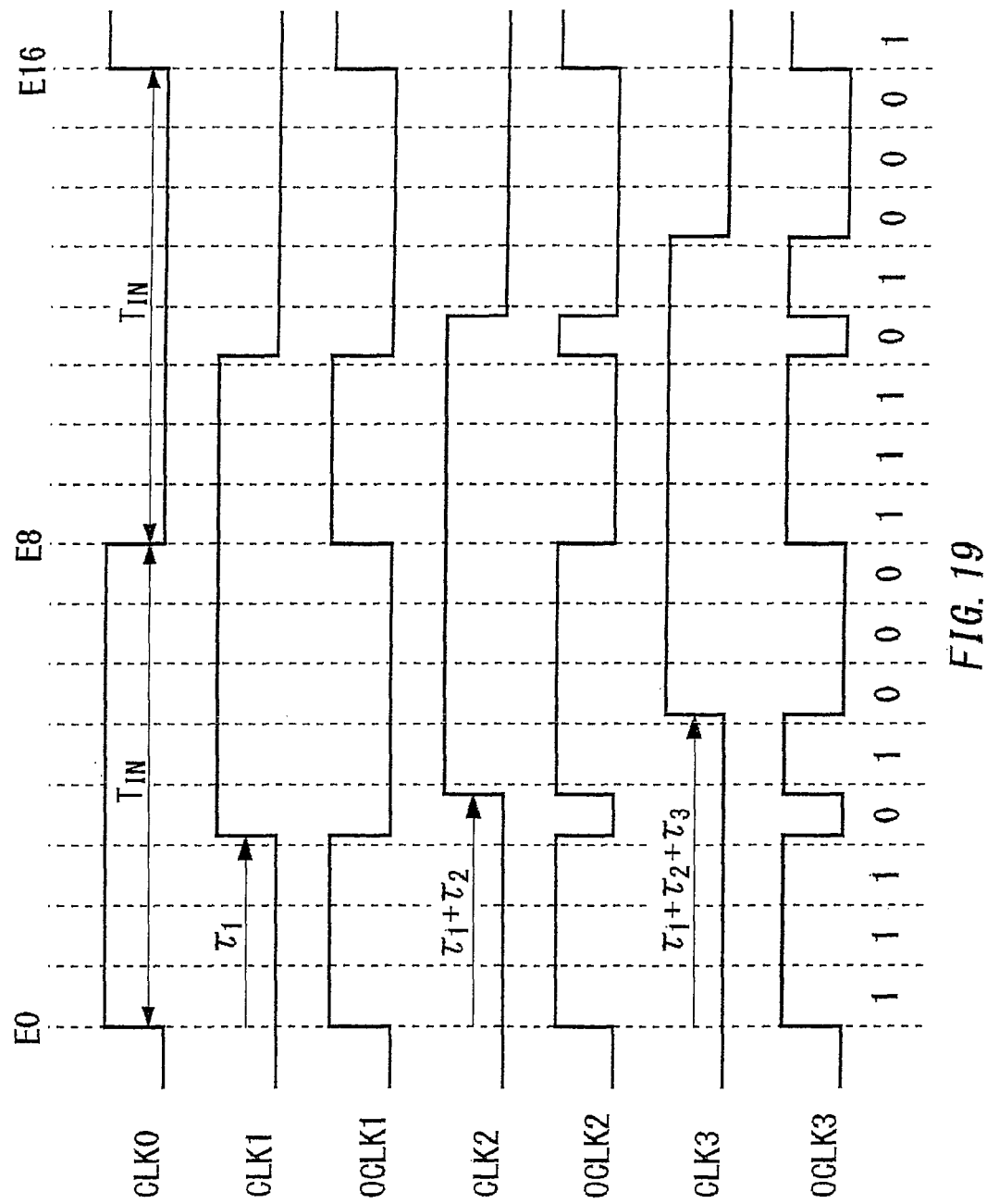
FIG. 19 is a timing chart showing an exemplary operation of the jitter injection circuit 100 that injects jitter into a data signal.

FIG. 19 is a timing chart showing an exemplary operation of a jitter injection circuit 100 that injects jitter into a data signal having a predetermined logic pattern. When the data signal is generated, the plurality of delay circuits 10 sequentially delay the supplied reference signal by delay amounts corresponding to integer multiples of single bit unit times of the data signal. In the present embodiment, the plurality of delay circuits 10 sequentially delay the reference signal by delay amounts corresponding to a number of consecutive bits having identical logic values in the logic pattern to be included in the data signal.

In the present embodiment, an example is described in which the jitter is injected into a data signal in which the logic pattern "11101000" is repeated. In this case, the reference period control section 40 may generate a reference signal having a period substantially equal to a value obtained by multiplying the number of bits in the repeating logic pattern by the time of a single bit of the data signal.

The selecting section 50 selects the signal output by the delay circuit 10 that is at a stage number corresponding to the number of times that the data changes in the repeating logic pattern "11101000." In the present embodiment, because the logic value changes three times in the repeating logic pattern "11101000," the selecting section 50 selects the signal output by the third stage logic circuit 22.

The delay setting section 30 sets the delay amount for each delay circuit 10 based on the number of consecutive bits having the same logic value in the logic value pattern to be included in the data signal. The delay setting section 30 may determine what multiple of the single bit unit time of the data signal is used for the delay amount to be set for each delay circuit based on the number of consecutive bits having the same logic value in the logic pattern to be included in the data signal, and may set for each delay circuit a value obtained by adding or subtracting a jitter value to be injected to or from each of the determined delay amounts.

For example, in the repeating logic pattern "11101000" to be included in the data signal of the present embodiment, the first logic value "1" is consecutive for three bits. Therefore, the delay setting section 30 sets as the delay amount τ1 of the first stage delay circuit 10-1 a value obtained by adding or subtracting the jitter value to be injected to or from a time of three bit units (three times the average period of the jittery signal) in the data signal.

Next in the logic pattern "11101000" is one bit having a logic value of zero. Therefore, the delay setting section 30 sets as the delay amount τ2 of the second stage delay circuit 10-2 a value obtained by adding or subtracting the jitter value to be injected to or from a time of one bit unit in the data signal.

In the same manner, the delay setting section 30 sets as the delay amount τ3 of the third stage delay circuit 10-3 a value obtained by adding or subtracting the jitter value to be injected to or from a time of one bit unit in the data signal. The selecting section 50 selects the signal output by the third stage logic circuit 22 as the data signal. Through such a process, a data signal can be generated into which jitter is injected by using the jitter injection circuit 100.

Figure 20:
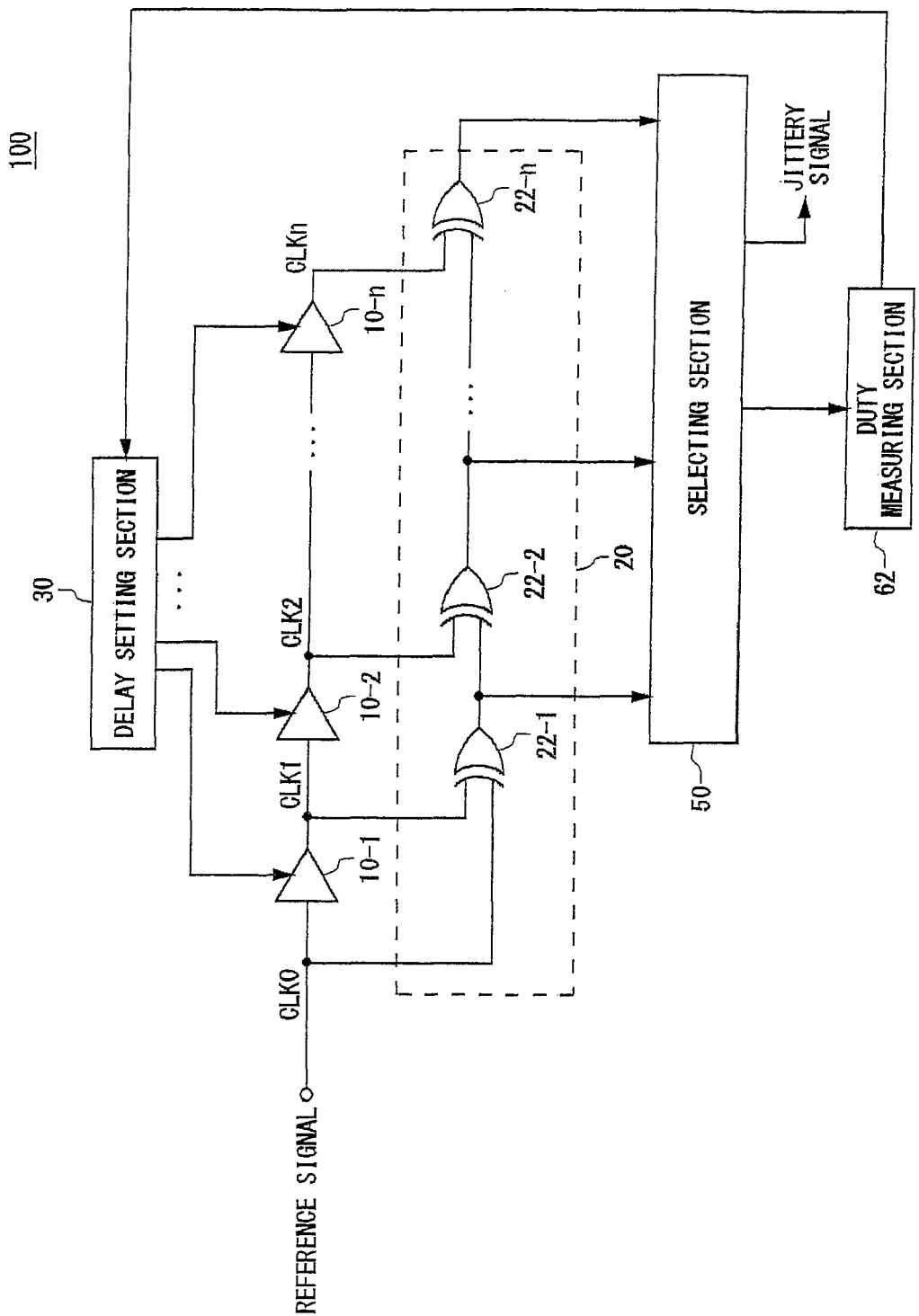
FIG. 20 shows another exemplary configuration of the jitter injection circuit 100.

FIG. 20 shows another exemplary configuration of the jitter injection circuit 100. The jitter injection circuit 100 of the present embodiment is further provided with a duty measuring section 62 in addition to the configuration of any one jitter injection circuit 100 described in relation to FIGS. 1 to 19. FIG. 20 shows a configuration in which the duty measuring section 62 is added to the configuration of the jitter injection circuit 100 shown in FIG. 3.

The duty measuring section 62 sequentially measures duty ratios of the outputs signals of each logic circuit 22. The duty ratio of the output signal may refer to a ratio between a period in which the output signal is logic H and a period in which the output signal is logic L. The duty measuring section 62 may detect the duty ratio by integrating or averaging the signal level of the output signal.

The output signal of each logic circuit 22 may be sequentially selected by the selecting section 50 and supplied to the duty measuring section 62. For example, in a case where the duty ratios of the output signals are sequentially measured, the selecting section 50 may select the output signals from each logic circuit 22 in order from the first stage logic circuit 22 to the last stage logic circuit 22 and supply the selected signals to the duty measuring section 62.

The duty measuring section 62 measures the duty ratio of the output signal supplied from the selecting section 50. The duty ratio corresponds to the delay amount of the corresponding delay circuit 10. For example, the duty ratio of the output signal OCLK1 output by the first stage logic circuit 22-1 is $\tau 1/(T_{IN}-\tau 1)$. Because the pulse width $T_{IN}$ of the reference signal is already known, the delay amount $\tau 1$ of the first stage delay circuit 10-1 can be obtained from the duty ratio.

In the same manner, the duty ratio of the output signal OCLK2 output by the second stage logic circuit 22-2 is $(T_{IN}-\tau 2)/\tau 2$. The delay setting section 30, based on the pulse width measured by the duty measuring section 62, adjusts the delay amount of the corresponding delay circuit 10.

After the delay setting section 30 adjusts the delay amount of the delay circuit 10 at a certain stage, the selecting section 50 selects the pulse width of the output signal of the logic circuit 22 at the subsequent stage and supplies the selected pulse width to the duty measuring section 62. In other words, after the delay setting section 30 adjusts the delay amount of the delay circuit 10 at a certain stage, the duty measuring section 62 measures the pulse width of the output signal of the logic circuit 22 at the subsequent stage.

In the jitter injection circuit 100 of the present embodiment, the delay amounts of the delay circuits 10 at all of the prior stages affect the duty ratio of the output signals output by the logic circuits 22 at all of the following stages. For example, the duty ratio of the output signals output by the logic circuits 22 at odd numbered stages is expressed by $(\tau 1+\tau 3+\tau 5+\ldots)/(T_{IN}-(\tau 1+\tau 3+\tau 5+\ldots))$ and the duty ratio of the output signals output by the logic circuits 22 at even numbered stages is expressed by $(T_{IN}-(\tau 2+\tau 4+\tau 6+\ldots))/(\tau 2+\tau 4+\tau 6+\ldots)$.

Even in such a case, the delay amount $\tau k$ of a certain delay circuit 10 at a prior stage is already known because the delay amounts are adjusted in order from previous delay circuits 10 as described above. Therefore, the delay amount of each delay circuit 10 can be obtained from the duty ratio of the corresponding output signal. By using such a configuration, the waveform of the jitter injected into the jittery signal can be accurately adjusted.

Figure 21:
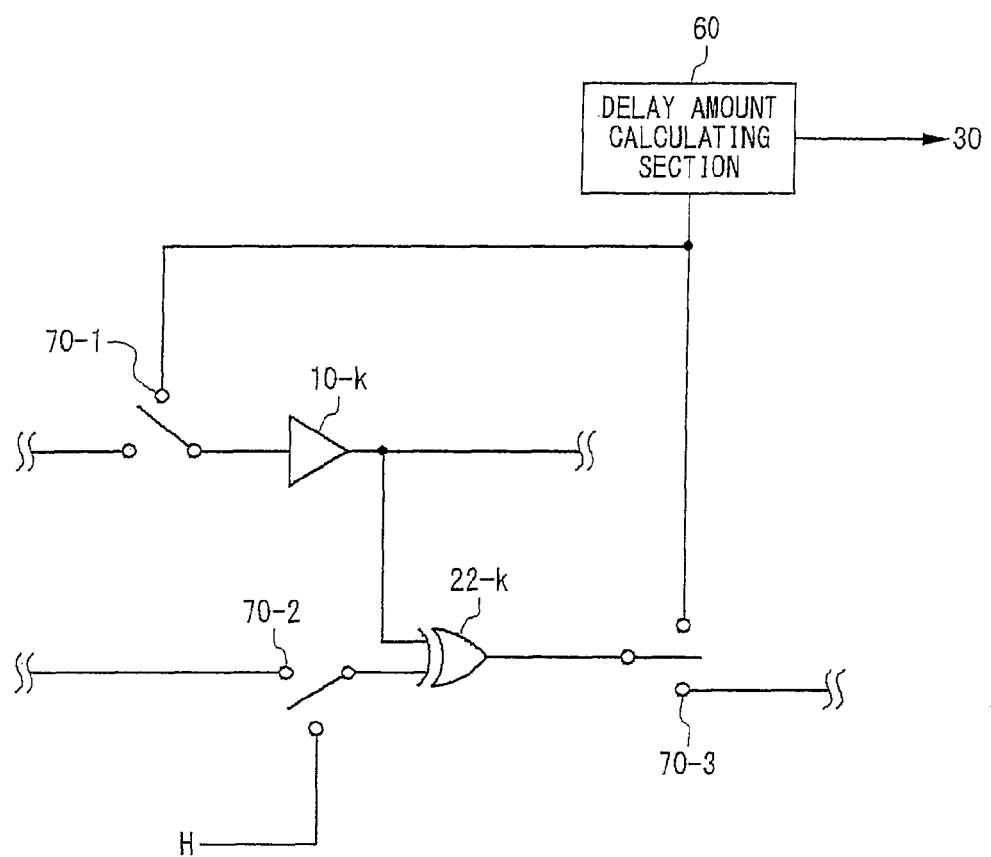
FIG. 21 shows another exemplary configuration of the jitter injection circuit 100.

FIG. 21 shows another exemplary configuration of the jitter injection circuit 100. The jitter injection circuit 100 of the present embodiment is further provided with a delay amount calculating section 60 and a switching section 70 in addition to the configuration of any one of the jitter injection circuits 100 described in relation to FIGS. 1 to 19, and measures the delay amount of each delay circuit 10. FIG. 21 shows the configuration of the jitter injection circuit 100 with a portion thereof described in relation to FIGS. 1 to 19 omitted.

The switching section 70 is provided to the delay circuit 10 at each stage. The switching section 70 at each stage may include a first switching section 70-1, a second switching section 70-2, and a third switching section 70-3. The switching section 70, when measuring the delay amount of each delay circuit 10, switches the transmission path of the output signal of each delay circuit 10 such that the signal forms a loop that returns to the input of the delay circuit 10.

More specifically, during measuring of the delay amount, the first switching section 70-1 inputs the signal from the third switching section 70-3 into the delay circuit 10 instead of the signal from the delay circuit 10 at the stage immediately prior. During measuring of the delay amount, the second switching section 70-2 inputs a signal fixed at a prescribed logic value into the logic circuit 22 instead of the signal from the logic circuit 22 at the stage immediately prior. During measuring of the delay amount, the third switching section 70-3 inputs the output signal of the logic circuit 22 into the delay circuit 10 via the first switching section 70-1 without being supplied to the logic circuit 22 at the stage immediately thereafter. By using such a configuration, the switching section 70 can form a loop in which the output signal of the delay circuit 10 is fed back to the input of the same delay circuit 10.

The delay amount calculating section 60 calculates the delay amount of the delay circuit 10 based on the period of the signal transmitted in the loop formed by the switching section 70. For example, the delay amount calculating section 60 may measure the period of the signal transmitted from the third switching section 70-3 to the first switching section 70-1. Furthermore, the delay amount calculating section 60 may input a single pulse into the loop to measure the period in which the pulse circles through the loop. The thus measured period corresponds to the delay amount in the delay circuit 10.

The delay setting section 30 sets the delay amount in each delay circuit 10 further based on the delay amounts calculated by the delay amount calculating section 60. The delay amount calculating section 60 may measure the delay amount of the delay circuit 10 at each stage in parallel. Through such a configuration, the waveform of the jitter to be injected into the jittery signal can be accurately adjusted.

Figure 22:
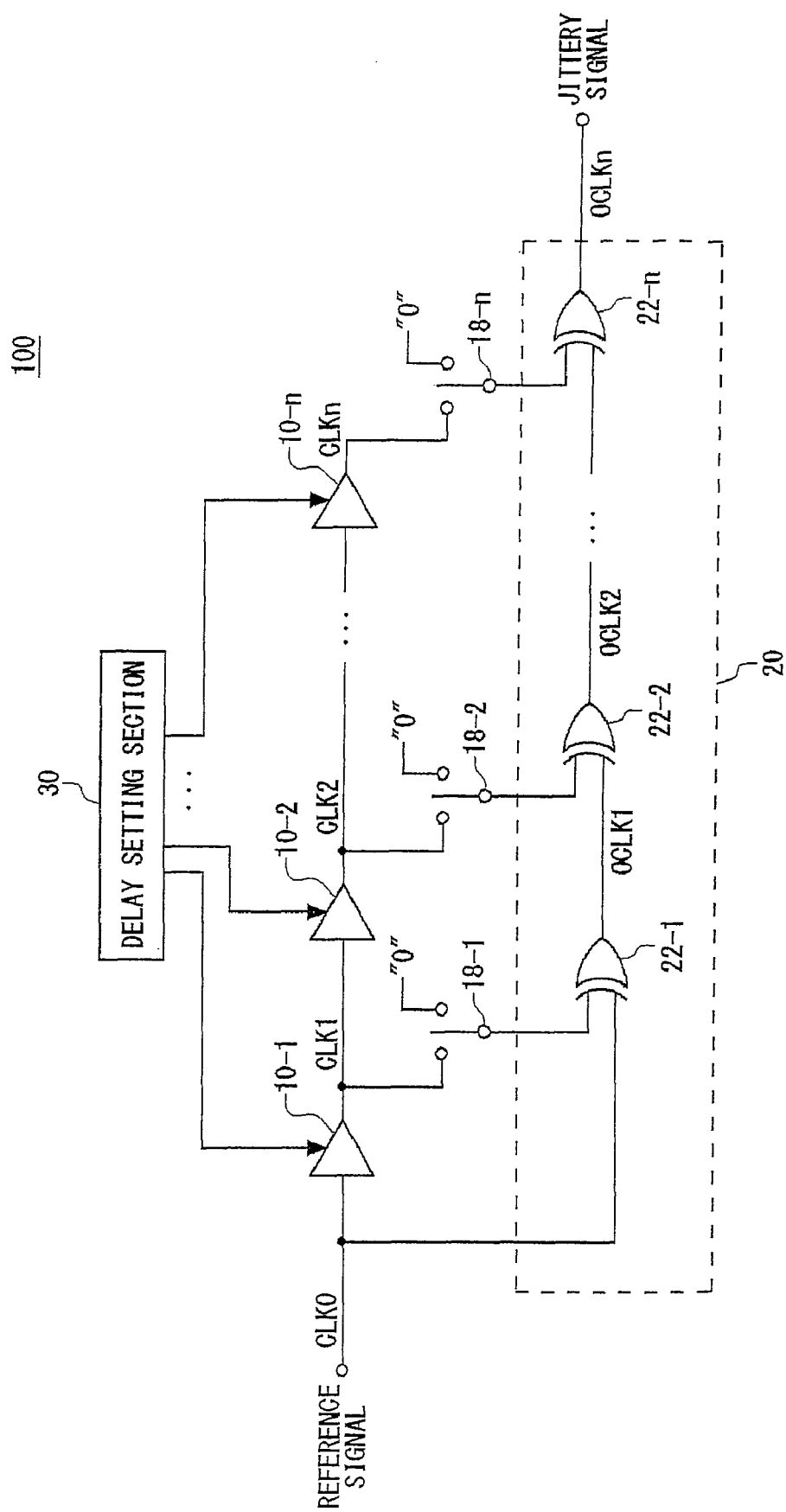
FIG. 22 shows another exemplary configuration of the jitter injection circuit 100.

FIG. 22 shows another exemplary configuration of the jitter injection circuit 100. The jitter injection circuit 100 of the present embodiment is further provided with a plurality of switches 18 in addition to the configuration of any one of the jitter injection circuits 100 described in relation to FIGS. 1 to 21. The plurality of switches 18 are disposed to correspond one-to-one with the plurality of pairs of delay circuits 10 and logic circuits 22. It should be noted that the jitter injection circuit 100 need not be provided with the pulse generating section 24 and a frequency divider 28.

Each switch 18 switches whether the output signal CLKk of the corresponding delay circuit 10 or the prescribed logic value is input into the corresponding logic circuit 22. A logic value causing each switch 18 to function as a buffer of the logic circuit 22 is supplied to each switch 18. For example, when the logic circuit 22 is an exclusive OR circuit, the switch 18 is provided with a logic value of zero.

By using the configuration described above, the waveform of the jittery signal can be controlled. The following is a description of a performance of the jitter injection circuit 100 in which the output signal of the delay circuit 10 is input to the logic circuit 22 when each switch 18 is turned on and the logic value zero is input to the logic circuit 22 when each switch 18 is turned off.

For example, by turning each switch 18 on or off, the jitter injection circuit 100 of the present embodiment can control the repeating logic pattern in the jittery signal in order to generate the data signal that includes the prescribed logic pattern. In such a case, each delay circuit 10 may generate a delay obtained by adding or subtracting a jitter value to be injected to or from the single bit unit of time in the jittery signal (data signal). Furthermore, the switch 18-k at the k-th stage corresponds to the (k+1)-th stage bit of the repeating logic pattern in the jittery signal.

Each switch 18 selects a plurality of signals to be supplied to the signal generating section 20 from among the signals output by the delay circuits 10 based on the logic pattern to be included in the data signal. More specifically, each switch 18 is turned on when the logic value of the corresponding bit is different from the logic value of the previous bit. Furthermore, each switch 18 is turned off when the logic value of the corresponding bit is the same as the logic value of the previous bit. Through such an operation, the logic pattern in the jittery signal can be controlled.

The jitter injection circuit 100 of the present embodiment can output the output of the logic circuit 22 at a prescribed stage as the jittery signal without being provided with the selecting section 50 shown in FIG. 3. For example, in a case where the output of the k-th stage logic circuit 22 is output as the jittery signal, the output of the k-th stage logic circuit 22 can be obtained by turning off the switches 18 from the (k+1)-th stage onward.

Figure 23:
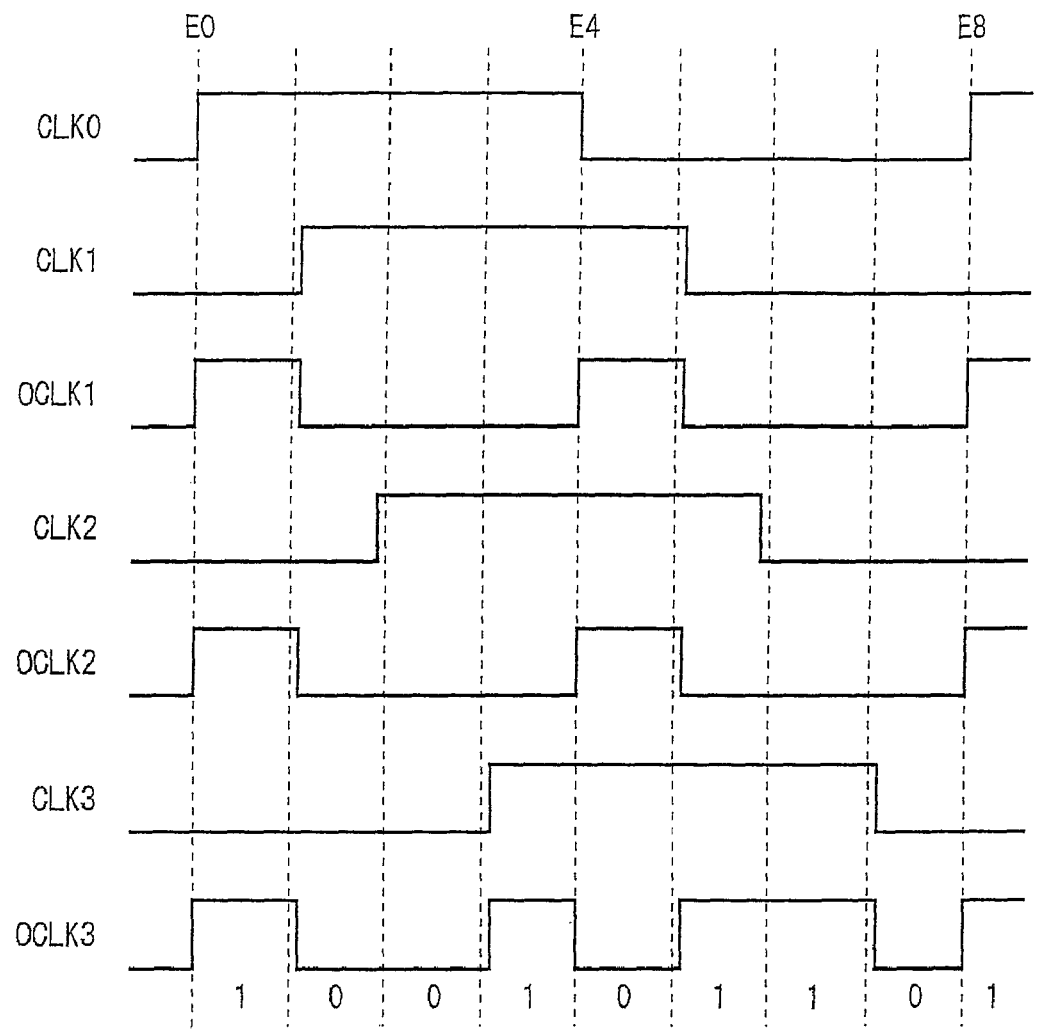
FIG. 23 describes an exemplary operation of the jitter injection circuit 100 shown in FIG. 22.

FIG. 23 describes an exemplary operation of the jitter injection circuit 100 shown in FIG. 22. In the present embodiment, a case is described in which a jittery signal is generated in which a logic pattern of "1001" is repeated while being inverted. In such a case, the logic value changes between the first bit and the second bit in the logic pattern and changes again between the third bit and the fourth bit in the logic pattern. Therefore, the switches 18 at the first stage and the third stage are turned on.

Furthermore, the second stage switch 18-2 is turned off because the logic values of the second bit and the third bit in the logic pattern are the same. In a case where switches 18 exist beyond the third stage, such switches 18 are turned off.

Because the first stage switch 18-1 is turned on, the output signal of the first stage delay circuit 10-1 is input into the first stage logic circuit 22-1. Therefore, the first stage logic circuit 22-1 outputs the signal OCLK1 having edges at positions according to the delay amount of the delay circuit 10-1.

Because the second stage switch 18-2 is turned off, the logic value zero is input into the second stage logic circuit 22-2. Therefore, the second stage logic circuit 22-2 functions as a buffer that allows the output signal of the first stage logic circuit 22-1 to pass through. Because of this, the logic circuit 22-2 outputs the output signal OCLK2, in which edges are not present at positions according to the delay amount of the delay circuit 10-2.

Because the third stage switch 18-3 is turned on, the output signal of the third stage delay circuit 10-3 is input into the third stage logic circuit 22-3. Therefore, the third stage logic circuit 22-3 outputs the output signal OCLK3 further having edges at positions according to the delay amount of the delay circuit 10-3 added to the output signal OCLK2 of the logic circuit 22-2.

Because the switches 18 from the fourth stage onward are turned off, the output signal OCLK3 of the logic circuit 22-3 is output as the jittery signal. Through such an operation, jitter can be injected into the jittery signal in which the logic pattern "1001" is repeated while being inverted and the thus achieved jittery signal can be output.

Figure 24:
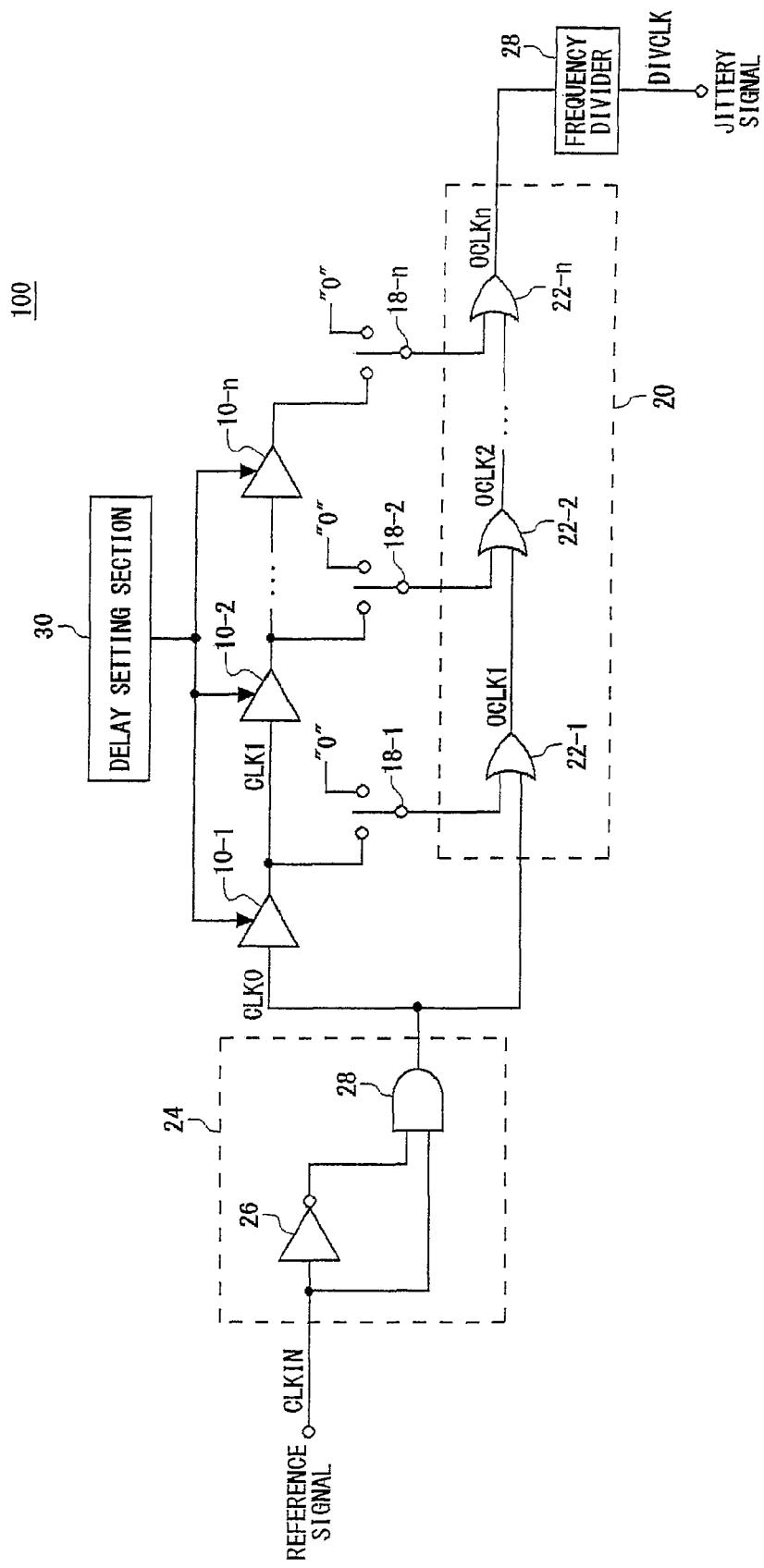
FIG. 24 shows another exemplary configuration of the jitter injection circuit 100.

FIG. 24 shows another exemplary configuration of the jitter injection circuit 100. The jitter injection circuit 100 of the present embodiment is further provided with the pulse generating section 24 and the frequency divider 28 in addition to the configuration of the jitter injection circuit 100 described in relation to FIG. 23. The pulse generating section 24 may be the same as the pulse generating section 24 described in relation to FIG. 6. In other words, the pulse generating section 24 provides the reference signal CLK0 containing a pulse for each rising edge of the reference signal $CLK_{IN}$ to the delay circuit 10-1 at the first stage and the logic circuit 22-1 at the first stage.

The frequency divider 28 outputs as the jittery signal a signal DIVCLK obtained by frequency dividing the output signal OCLKn of the signal generating section 20 by two. By using such a configuration, the waveform of the jittery signal can be controlled in the same manner as by the jitter injection circuit 100 described in relation to FIG. 23.

Figure 25:
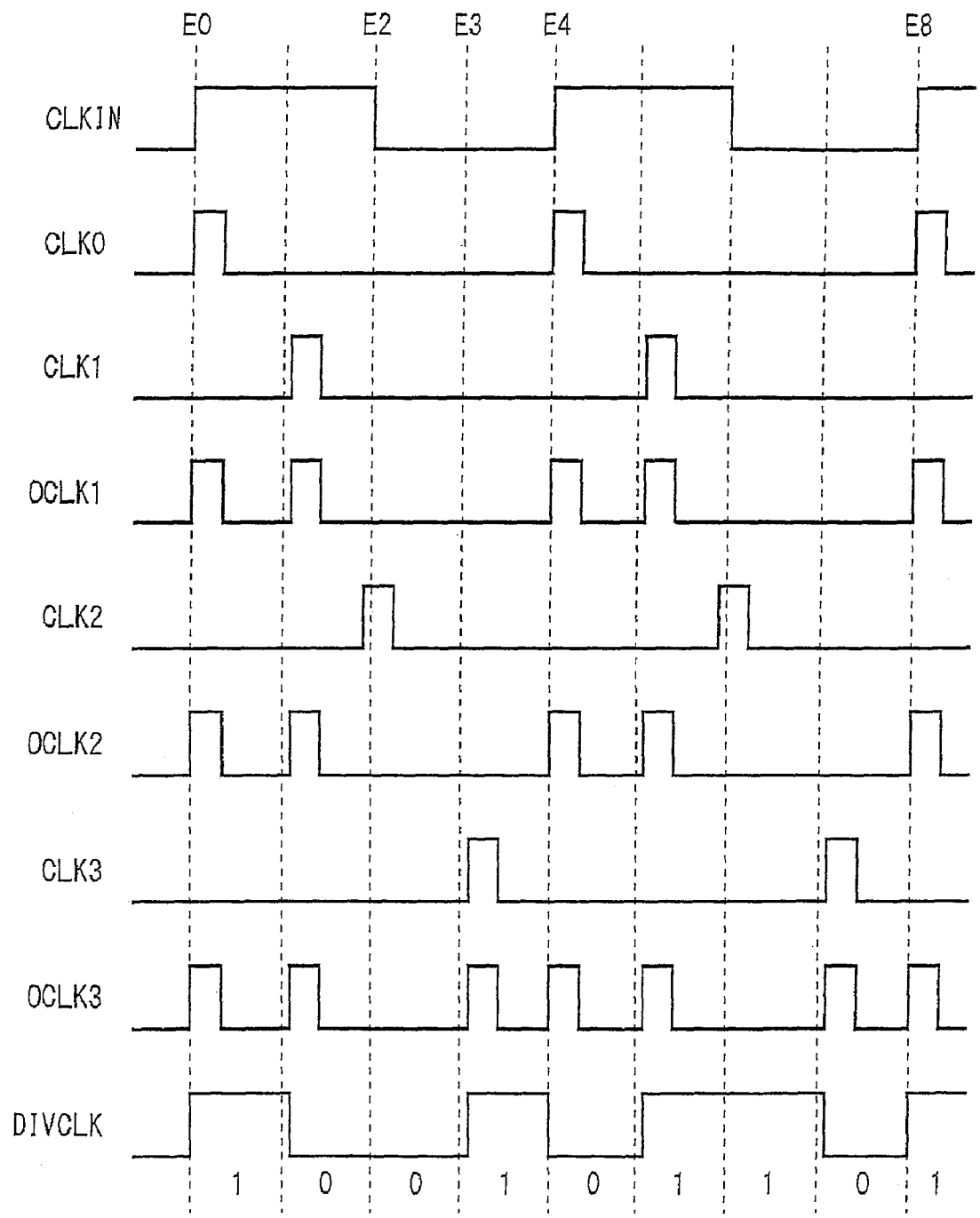
FIG. 25 describes an exemplary operation of the jitter injection circuit 100 shown in FIG. 24.

FIG. 25 describes an exemplary operation of the jitter injection circuit 100 shown in FIG. 24. The jitter injection circuit 100 of the present embodiment generates the jittery signal in which the logic pattern "1001" is repeated while being inverted, in the same manner as the jitter injection circuit 100 described in relation to FIG. 23. The operations of the plurality of delay circuits 10, the plurality of switches 18, and the plurality of logic circuits 22 are the same as those of the jitter injection circuit 100 described in relation to FIG. 23, and therefore the description thereof is omitted.

The output signal OCLK3 of the logic circuit 22-3 corresponding to the final bit of the logic pattern of the jittery signal does not include the pulse in the period corresponding to the third bit (E2 to E3) in which the logic value does not change in the logic pattern, but does include the pulse in periods corresponding to bits at which the logic value changes in the logic pattern. The frequency divider 28 generates the jittery signal DIVCLK by frequency dividing the output signal OCLK3 of the logic circuit 22-3 by two.

Here, frequency dividing by two may refer to a process of generating a signal in which the logic value changes for each rising edge of the pulse of the original signal. Through the operation described above, jitter can be injected into the jittery signal in which the logic pattern "1001" is repeated while being inverted and the thus achieved jittery signal can be output.

As shown in FIGS. 23 and 25, whether the logic pattern is inverted when repeating or repeats without being inverted is determined by the number of times that the logic value changes in a single logic pattern. In a case where the number of changes is even, the logic pattern is repeated without being inverted, and in a case where the number of changes is odd, the logic signal is inverted when repeating.

Figure 26:
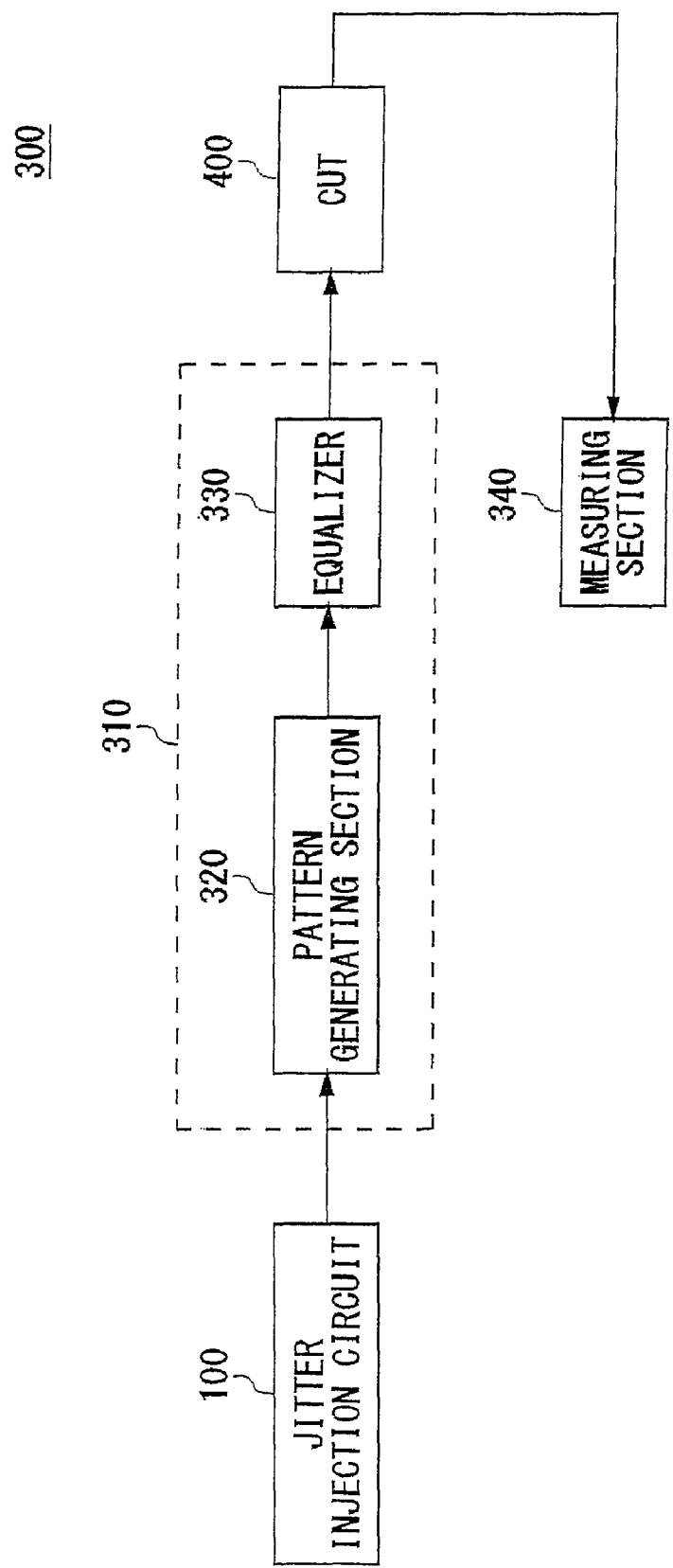
FIG. 26 shows an exemplary configuration of a test apparatus 300 according to an embodiment together with a device under test 400.

FIG. 26 shows an exemplary configuration of a test apparatus 300 according to an embodiment coupled with a device under test 400. The test apparatus 300 is an apparatus that tests the device under test 400, such as a semiconductor circuit, and is provided with the jitter injection circuit 100, a test signal generating section 310, and a measuring section 340.

The jitter injection circuit 100 may be the same as any one of the jitter injection circuits 100 described in relation to FIGS. 1 to 21. As described above, the jitter injection circuit 100 can generate a jittery signal that includes high frequency jitter.

The test signal generating section 310 generates a test signal based on the jittery signal and supplies the generated test signal to the device under test 400. For example, the test signal generating section 310 may use the jittery signal as a clock to generate the test signal. The test signal generating section 310 of the present embodiment includes a pattern generating section 320 and an equalizer 330.

The pattern generating section 320 includes a predetermined logic pattern and generates a test signal that has as a bit boundary designated by each edge of the jittery signal. Through such a configuration, a test signal including high frequency jitter can be generated. The equalizer 330 compensates the waveform of the test signal in advance according to transmission loss between the test signal generating section 310 and the device under test 400.

The measuring section 340 makes a judgment concerning pass/fail of the device under test 400 by measuring a response signal output by the device under test 400 in response to the test signal. For example, the measuring section 340 may make a judgment concerning pass/fail of the device under test 400 based on whether the logic pattern of the response signal matches a prescribed expected value pattern.

The jitter tolerance of the device under test 400 can be tested by adjusting the frequency and amplitude of the jitter generated by the jitter injection circuit 100. For example, the test apparatus 300 can test whether the device under test 400 fulfills the jitter tolerance specifications by causing the jitter injection circuit 100 to generate jitter having a frequency and amplitude designated by the jitter tolerance specifications of the device under test 400. The device under test 400 can be tested using a test signal that includes high frequency jitter.

Figure 27:
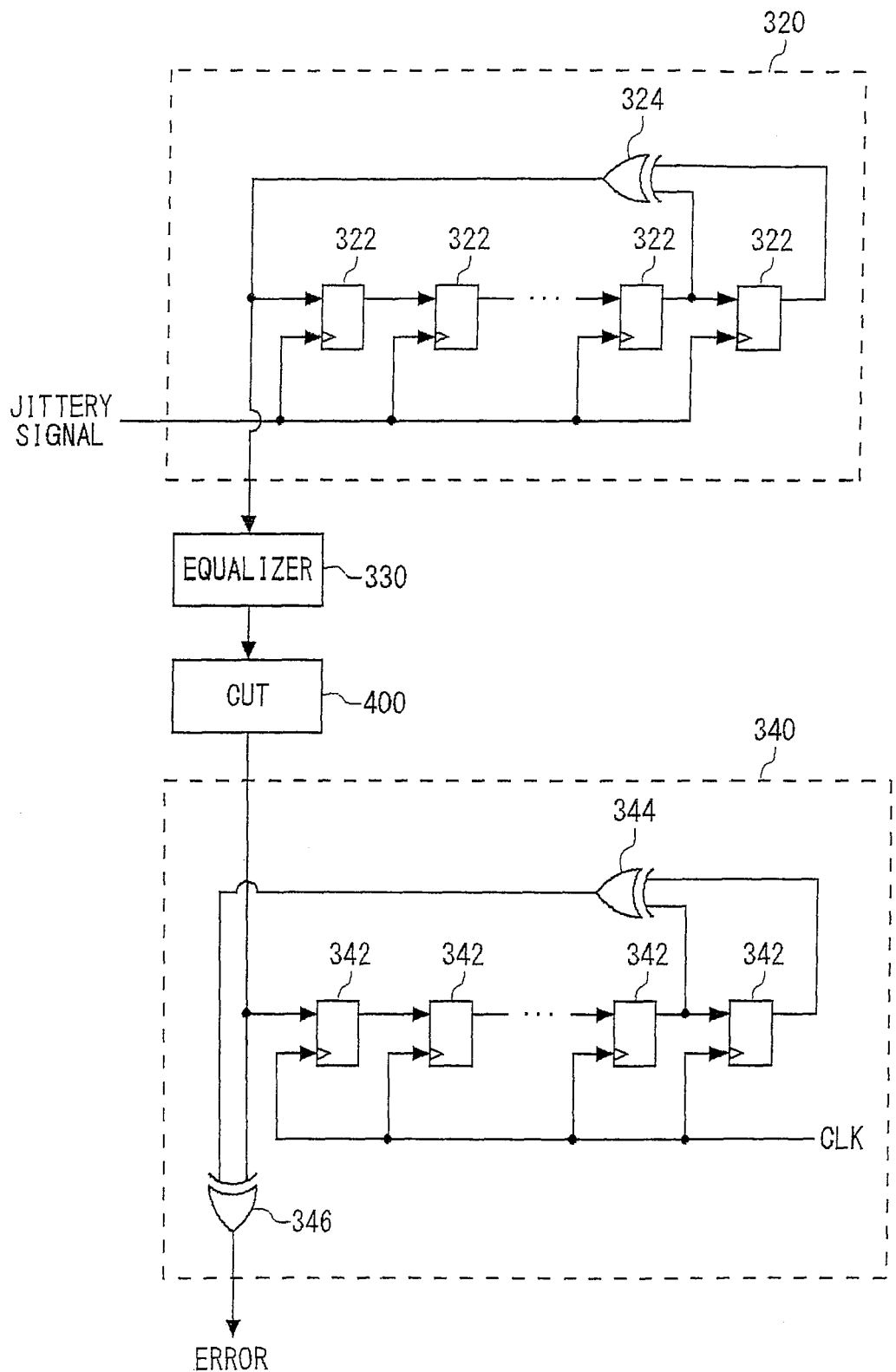
FIG. 27 shows an exemplary configuration of a pattern generating section 320 and a measuring section 340.

FIG. 27 shows exemplary configurations of the pattern generating section 320 and the measuring section 340. The pattern generating section 320 of the present embodiment generates a test signal that includes a PRBS (Pseudo-Random Binary Sequence) logic pattern by using an LFSR (Linear Feedback Shift Register). The pattern generating section 320 includes a plurality of flip-flops 322 and an exclusive OR circuit 324.

Each flip-flop 322 receives the jittery signal from the jitter injection circuit 100 in parallel, acquires the signal output by the flip-flop 322 at the stage immediately prior according to each edge of the jittery signal, and outputs the acquired signal. The first stage flip-flop 322 acquires the signal output by the exclusive OR circuit 324 according to the jittery signal. In a case where the jitter injection circuit 100 is provided with the pulse generating section 24 as described in relation to FIG. 6, each flip-flop 322 may operate according to a rising edge of the jittery signal.

The exclusive OR circuit 324 outputs as the test signal an exclusive OR of the signals output by two flip-flops 322 selected according to a generator polynomial of the LFSR. By using such a configuration, a PRBS test signal having jitter according to the jittery signal can be generated.

The measuring section 340 generates the expected value pattern using the LFSR having the same configuration as that of the pattern generating section 320. The measuring section 340 includes a plurality of flip-flops 342, an exclusive OR circuit 344, and a comparing section 346.

The plurality of flip-flops 342 and the exclusive OR circuit 344 may have the same function and configuration as the plurality of flip-flops 322 and the exclusive OR circuit 324. However, each flip-flop 342 operates according to a clock signal into which jitter is not injected. Furthermore, the first stage flip-flop 342 acquires the response signal of the device under test 400 according to the clock signal. By using such a configuration, the exclusive OR circuit 344 can sequentially generate the logic values to be indicated by the response signal of the device under test 400.

The comparing section 346 compares the logic value of the response signal of the device under test 400 to the logic value of the signal output by the exclusive OR circuit 344 and outputs an error signal that indicates whether the aforementioned logic values match. Furthermore, the bit error ratio of the device under test 400 may be measured by measuring a rate at which non-matching logic values occur with the comparing section 346.

Figure 28:
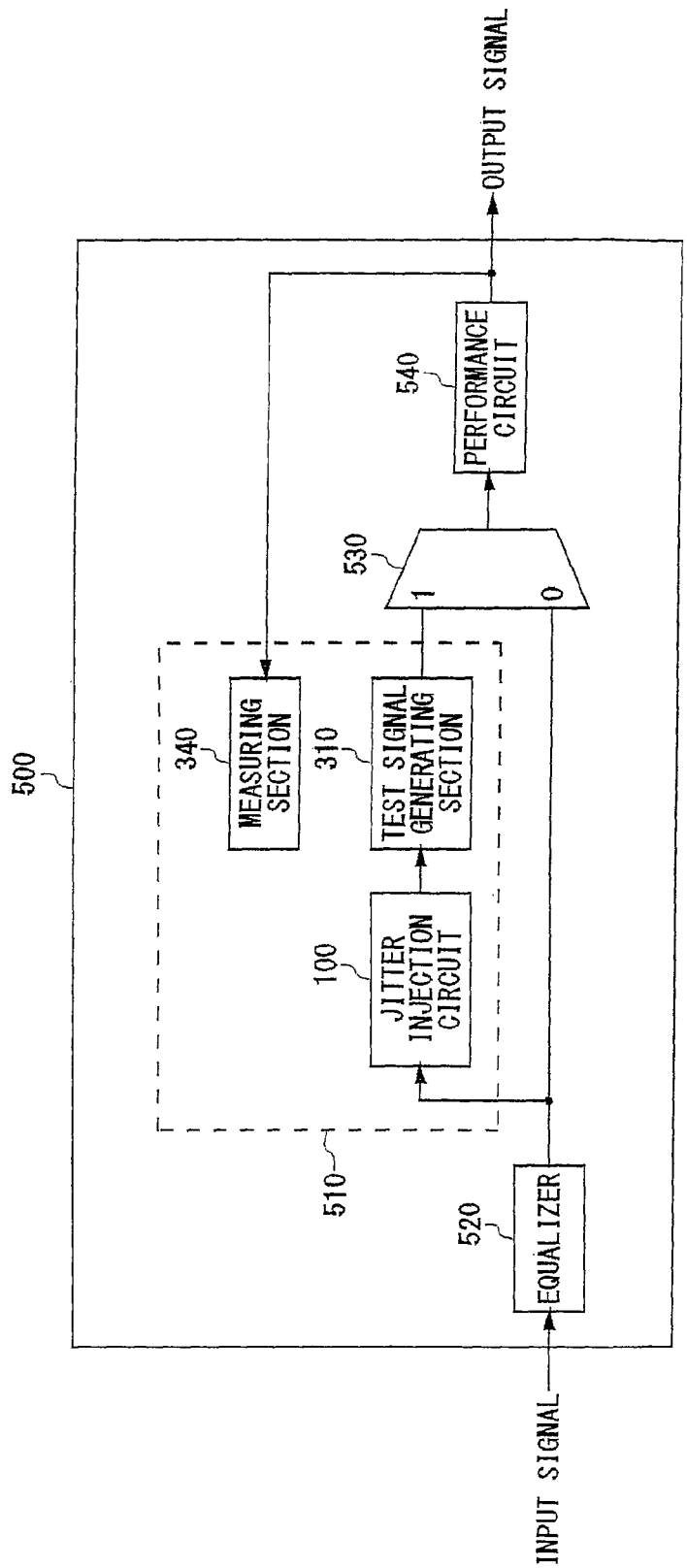
FIG. 28 shows an exemplary configuration of an electronic device 500 according to an embodiment.

FIG. 28 shows an exemplary configuration according to an electronic device 500 of an embodiment. The electronic device 500 may be a device such as a semiconductor chip that outputs an output signal in response to an input signal, for example. The electronic device 500 is provided with an equalizer 520, a self diagnostic section 510, a multiplexer 530, and a performance circuit 540.

The equalizer 520 compensates the waveform of the input signal according to signal loss in the transmission path of the input signal. The multiplexer 530 selects the input signal and supplies the selected signal to the performance circuit 540 when the electronic device 500 is operating normally.

The self diagnostic section 510 tests the performance circuit 540 when the electronic device 500 performs a self diagnosis. The self diagnostic section 510 includes the jitter injection circuit 100, the test signal generating section 310, and the measuring section 340. The jitter injection circuit 100, the test signal generating section 310, and the measuring section 340 may have the same function and configuration as the elements described using the same reference numerals in FIG. 26. The jitter injection circuit 100 may receive an input signal supplied from the outside as the reference signal.

The multiplexer 530 selects the test signal generated by the self diagnostic section 510 and supplies the selected test signal to the performance circuit 540 when the electronic device 500 performs the self diagnosis. The measuring section 340 makes a judgment concerning pass/fail of the performance circuit 540 based on the response signal of the performance circuit 540.

Through the configuration described above, the electronic device 500 performs a self diagnosis to determine pass/fail of the performance circuit 540. Furthermore, because high frequency jitter can be generated by the jitter injection circuit 100, the electronic device 500 can test the performance circuit 540 using the test signal that contains the high frequency jitter.

Figure 29:
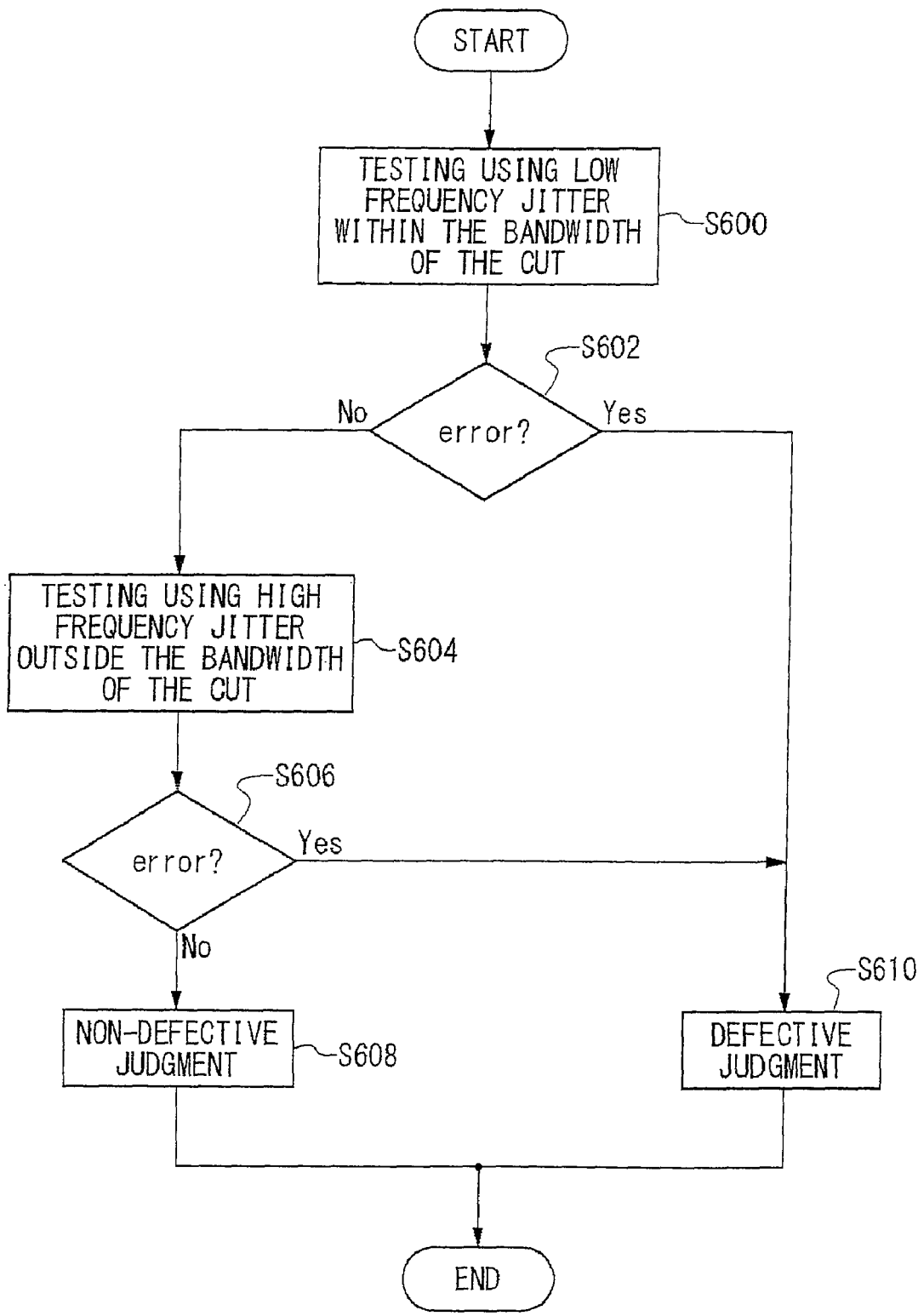
FIG. 29 is a flow chart showing an exemplary operation of the test apparatus 300.

FIG. 29 is a flow chart showing an exemplary operation of the test apparatus 300. The test apparatus 300 of the present embodiment performs a test in which low frequency jitter within an operational bandwidth of the device under test 400 is used and a test in which high frequency jitter outside the operational bandwidth of the device under test 400 is used.

First, the test apparatus 300 tests the device under test 400 using the low frequency jitter within the operational bandwidth of the device under test 400 (S600). In this case, the jitter injection circuit 100 generates a first jittery signal into which is injected jitter that includes the frequency that is within the operational bandwidth of the device under test 400. For example, in a case where the device under test 400 includes a PLL circuit, the jitter injection circuit 100 generates a jittery signal that includes jitter having a frequency within the loop bandwidth of the PLL circuit.

The test signal generating section 310 supplies the first test signal corresponding to the first jittery signal to the device under test 400. Next, the measuring section 340 makes a judgment concerning pass/fail of the device under test 400 based on a first response signal output by the device under test 400 in response to the first test signal. More specifically, the measuring section 340 makes a judgment as to whether a bit error occurs in the first response signal (S602). In a case where a bit error occurs, the measuring section 340 determines that the device under test 400 is a defective product (S610) and ends the testing.

In a case where the bit error does not occur in the low frequency jitter test so that the device under test 400 is determined to be non-defective, the test apparatus 300 tests the device under test using the high frequency jitter outside the operational bandwidth of the device under test 400 (S604). In this case, the jitter injection circuit 100 generates a second jittery signal that includes jitter having a frequency outside the operational bandwidth of the device under test 400. In other words, the jitter injection circuit 100 sequentially generates the first jittery signal and the second jittery signal.

The test signal generating section 310 supplies the second test signal corresponding to the second jittery signal to the device under test 400. Next, the measuring section 340 makes a judgment concerning pass/fail of the device under test 400 based on a second response signal output by the device under test 400 in response to the second test signal. More specifically, the measuring section 340 makes a judgment as to whether a bit error occurs in the response signal of the device under test 400 (S606). In a case where a bit error occurs, the measuring section 340 determines that the device under test 400 is a defective product (S610) and ends the testing. In a case where a bit error does not occur, the measuring section 340 judges the device under test 400 to be non-defective (S608) and ends the testing.

In the manner described above, the test apparatus 300 can easily perform testing of jitter tolerance outside of the operational bandwidth of the device under test 400 because the test apparatus 300 can easily generate high frequency jitter. Therefore, the test apparatus 300 can accurately determine pass/fail of the device under test 400.

Figure 30:
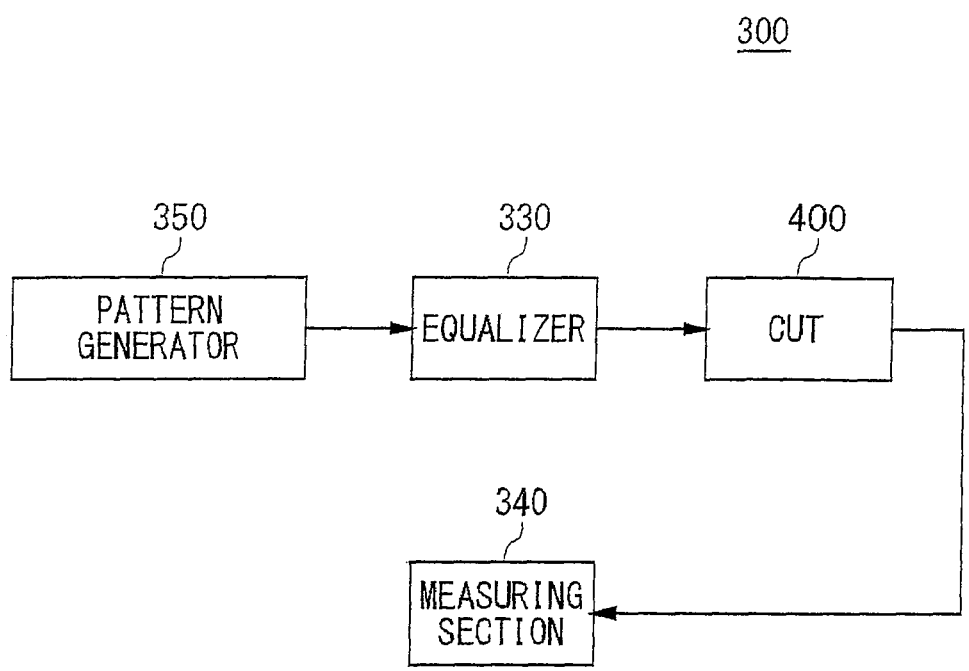
FIG. 30 shows another exemplary configuration of the test apparatus 300.

FIG. 30 shows another exemplary configuration of the test apparatus 300. The test apparatus 300 of the present embodiment is provided with a pattern generator 350, the equalizer 330, and the measuring section 340. The equalizer 330 may be the same as the equalizer 330 described in relation to FIG. 26. The measuring section 340 measures the response signal of the device under test 400 to make a judgment concerning pass/fail of the device under test 400.

The pattern generator 350 generates a test signal that includes both jitter and a predetermined logic pattern and supplies the generated test signal to the device under test 400. The pattern generator 350 may be included in any one of the jitter injection circuits 100 described in relation to FIGS. 19, 22, and 24 and may output the data signal generated by the jitter injection circuit 100 as the test signal.

Figure 31:
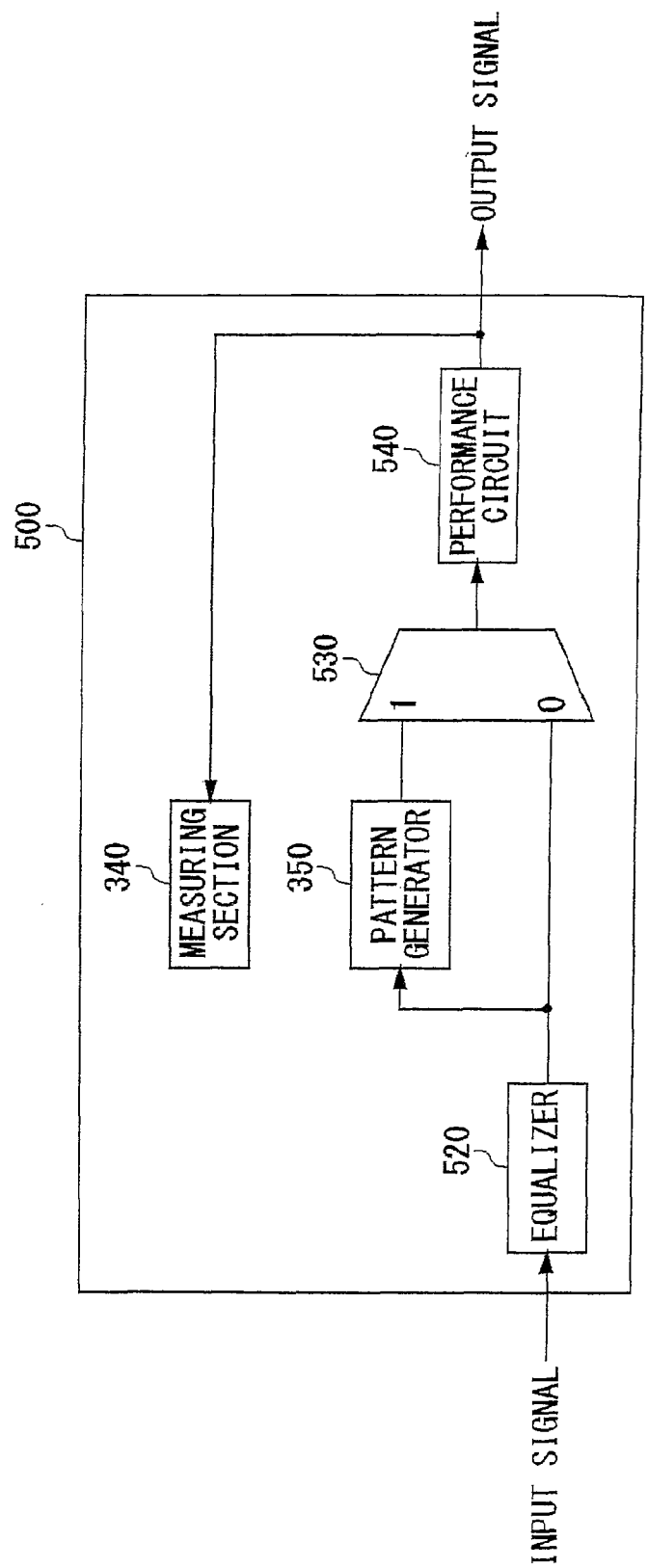
FIG. 31 shows another exemplary configuration of the electronic device 500.

FIG. 31 shows another exemplary configuration of the electronic device 500. The electronic device 500 of the present embodiment is provided with the equalizer 520, the pattern generator 350, the measuring section 340, the multiplexer 530, and the performance circuit 540. The equalizer 520, the multiplexer 530, and the performance circuit 540 may be the same as the equalizer 520, the multiplexer 530, and the performance circuit 540 described in relation to FIG. 28.

The pattern generator 350 and the measuring section 340 may be the same as the pattern generator 350 and the measuring section 340 described in relation to FIG. 30. Furthermore, the pattern generator 350 may receive the reference signal from the outside.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

As made clear from the above, by using the embodiments of the present invention, a jittery signal that includes high frequency period jitter can be easily generated. Furthermore, by testing a device under test or a performance circuit using the jittery signal, pass/fail of the device under test or the performance circuit can be accurately determined.

What is claimed is:

1. A jitter injection circuit that generates a jittery signal including jitter, comprising:
    a plurality of delay circuits that are connected in a cascading manner in stages and that each sequentially delay a supplied reference signal by a preset delay amount; and
    a signal generating section that generates each edge of the jittery signal according to a timing of the signal output by each delay circuit, wherein
    the delay amount of at least one delay circuit is set to be a value different from an integer multiple of an average period of the jittery signal.

2. The jitter injection circuit according to claim 1, further comprising a delay setting section that sets for each delay circuit the delay amount according to the jitter to be injected into each period of the jittery signal.

3. The jitter injection circuit according to claim 2, wherein a sum of the delay amounts of the plurality of delay circuits is less than a pulse width of the reference signal.

4. The jitter injection circuit according to claim 3, wherein
    the signal generating section generates a plurality of bits of the jittery signal for each single bit of the reference signal,
    the plurality of delay circuits are disposed to correspond to the plurality of bits of the jittery signal generated in each bit of the reference signal, and
    the delay setting section sets for each delay circuit a delay amount obtained by adding period jitter to be included in the corresponding bits of the jittery signal to the average period of the jittery signal.

5. The jitter injection circuit according to claim 2, wherein the delay setting section sets the delay amount of each delay circuit further based on the number of consecutive bits that have identical logic values in a logic pattern to be included in the jittery signal.

6. The jitter injection circuit according to claim 2, further comprising:
    a switching section that, when measuring the delay amount of each delay circuit, forms a loop in which an output signal of each delay circuit is returned to an input of the same delay circuit; and
    a delay amount calculating section that calculates a delay amount of the delay circuit based on a period of the signal transmitted in the loop, wherein
    the delay setting section sets the delay amount for each delay circuit further based on the delay amount calculated by the delay amount calculating section.

7. The jitter injection circuit according to claim 2, wherein the delay setting section changes the delay amount in each delay circuit by a frequency lower than a frequency of the reference signal.

8. The jitter injection circuit according to claim 2, wherein the delay setting section sets delay amounts that are greater than a predetermined reference value for the delay circuits in a first half of the stages and sets delay amounts that are smaller than the predetermined reference value for the delay circuits in a latter half of the stages.

9. The jitter injection circuit according to claim 8, wherein the delay setting section sets delay amounts obtained by adding a prescribed unit value to the reference value for the delay circuits in the first half of the stages and sets delay amounts obtained by subtracting the prescribed unit value from the reference value for the delay circuits in the latter half of the stages.

10. The jitter injection circuit according to claim 9, wherein the delay setting section sets as the reference value the delay amount of each delay circuit using an average period included in the jittery signal.

11. The jitter injection circuit according to claim 8, wherein
the signal generating section includes a plurality of exclusive OR circuits that are disposed to correspond one-to-one with the plurality of delay circuits,
the exclusive OR circuit at a first stage outputs an exclusive OR of an input signal and an output signal of the delay circuit at the first stage, and
the exclusive OR circuits from a second stage onward each output an exclusive OR of the output signal of the delay circuit at a stage immediately prior thereto and the output signal of the exclusive OR circuit at the stage immediately prior thereto, the jitter injection circuit further comprising:
buffers in the first half of the stages that are disposed to respectively correspond to the delay circuits in the first half of the stages and that further delay the output signal of the corresponding delay circuit according to a unit value; and
buffers in the latter half of the stages that are disposed to respectively correspond to the exclusive OR circuits in the latter half of the stages and that delay the input signal of the corresponding exclusive OR circuit according to the unit value.

12. The jitter injection circuit according to claim 11, wherein the buffers in the first half of the stages and the buffers in the latter half of the stages receive common control data for setting the delay amounts.

13. The jitter injection circuit according to claim 2, wherein the delay setting section sets delay amounts that are smaller than a predetermined reference value for the delay circuits in a first half of the stages and sets delay amounts that are greater than the predetermined reference value for the delay circuits in a latter half of the stages.

14. The jitter injection circuit according to claim 13, wherein
the signal generating section includes a plurality of exclusive OR circuits that are disposed to correspond one-to-one with the plurality of delay circuits,
the exclusive OR circuit at a first stage outputs an exclusive OR of an input signal and an output signal of the delay circuit at the first stage, and
the exclusive OR circuits from a second stage onward each output an exclusive OR of the output signal of the delay circuit at a stage immediately prior thereto and the output signal of the exclusive OR circuit at the stage immediately prior thereto, the jitter injection circuit further comprising:
buffers in the first half of the stages that are disposed to respectively correspond to the exclusive OR circuits in the first half of the stages and that delay the input signal of the corresponding exclusive OR circuit according to a unit value; and
buffers in the latter half of the stages that are disposed to respectively correspond to the delay circuits in the latter half of the stages and that further delay the output signal of the corresponding delay circuit according to the unit value.

15. The jitter injection circuit according to claim 14, wherein the buffers in the first half of the stages and the buffers in the latter half of the stages receive common control data for setting the delay amounts.

16. The jitter injection circuit according to claim 13, wherein the delay setting section sets delay amounts obtained by subtracting a prescribed unit value from the reference value for the delay circuits in the first half of the stages and sets delay amounts obtained by adding the prescribed unit value to the reference value for the delay circuits in the latter half of the stages.

17. The jitter injection circuit according to claim 16, wherein the delay setting section sets as the reference value the delay amount of each delay circuit using an average period included in the jittery signal.

18. The jitter injection circuit according to claim 1, wherein
the signal generating section includes a plurality of exclusive OR circuits that are disposed to correspond one-to-one with the plurality of delay circuits,
the exclusive OR circuit at a first stage outputs an exclusive OR of an input signal and an output signal of the delay circuit at the first stage, and
the exclusive OR circuits from a second stage onward each output an exclusive OR of the output signal of the delay circuit at a stage immediately prior thereto and the output signal of the exclusive OR circuit at the stage immediately prior thereto.

19. The jitter injection circuit according to claim 18, further comprising a reference period control section that controls a pulse width of the reference signal supplied to the plurality of delay circuits according to the period of the jitter to be injected into the jittery signal.

20. The jitter injection circuit according to claim 18, further comprising a selecting section that selects one of the output signals of the plurality of exclusive OR circuits according to the average period to be included in the jittery signal and outputs the selected output signal as the jittery signal.

21. The jitter injection circuit according to claim 18, further comprising a duty measuring section that sequentially measures a pulse width of the output signal of each exclusive OR circuit, wherein
the delay setting section, based on the pulse width measured by the duty measuring section, adjusts the delay amount of the corresponding delay circuit, and
the duty measuring section, after the delay setting section adjusts the delay amount of the delay circuit at a stage immediately prior thereto, measures the pulse width of the output signal of the exclusive OR circuit at an immediately following stage.

22. The jitter injection circuit according to claim 18, further comprising a plurality of switches that are disposed to correspond one-to-one with the plurality of exclusive OR circuits, wherein each switch switches whether the output signal of the corresponding delay circuit or a prescribed logic value is input to the corresponding exclusive OR circuit.

23. The jitter injection circuit according to claim 1, further comprising a data jitter injecting section that generates a data signal having a bit boundary designated by each edge timing of the jittery signal and injects data jitter into the generated data signal.

24. The jitter injection circuit according to claim 1, further comprising a low frequency jitter injecting section that injects into the reference signal jitter having a frequency lower than a frequency of jitter injected in the plurality of delay circuits and the signal generating section and inputs the thus achieved signal into the delay circuit at the first stage.

25. The jitter injection circuit according to claim 1, further comprising a low frequency jitter injecting section that injects into the jittery signal jitter having a frequency lower than a frequency of jitter injected in the plurality of delay circuits and the signal generating section.

26. A test apparatus that tests a device under test, comprising:
a jitter injection circuit that generates a jittery signal containing jitter;
a test signal generating section that generates a test signal based on the jittery signal and supplies the generated test signal to the device under test; and
a measuring section that measures a response signal output by the device under test in response
to the test signal and makes a judgment concerning pass/fail of
the device under test based on the measured response signal, wherein
the jitter injection circuit includes:
a plurality of delay circuits that are connected in a cascading manner and that each sequentially delay a supplied reference signal by a preset delay amount; and
a signal generating section that generates each edge of the jittery signal according to a timing of the signal output by each delay circuit, and
the delay amount of at least one delay circuit is set to be a value different from an integer multiple of an average period of the jittery signal.

27. The test apparatus according to claim 26, wherein
the jitter injection circuit sequentially generates a first jittery signal into which is injected jitter having a frequency that is within a bandwidth of the device under test and a second jittery signal into which is injected jitter having a frequency that is outside the bandwidth of the device under test, and
the test signal generating section and the measuring section supply to the device under test a first test signal dependent on the first jittery signal, make a judgment concerning pass/fail of the device under test based on a first response signal output by the device under test in response to the first test signal, and, in a case of a test result indicating pass, test the device under test using a second test signal dependent on the second jittery signal.

28. An electronic device that houses a performance circuit and a self diagnostic section that tests the performance circuit, wherein
the self diagnostic section includes:
a jitter injection circuit that generates a jittery signal containing jitter;
a test signal generating section that generates a test signal based on the jittery signal and supplies the generated test signal to the performance circuit; and
a measuring section that measures a response signal output by the performance circuit in response to the test signal and makes a judgment concerning pass/fail of the performance circuit,
the jitter injection circuit includes:
a plurality of delay circuits that are connected in a cascading manner and that each sequentially delay a supplied reference signal by a preset delay amount; and
a signal generating section that generates each edge of the jittery signal according to a timing of the signal output by each delay circuit, and
the delay amount of at least one delay circuit is set to be a value different from an integer multiple of an average period of the jittery signal.

29. A pattern generator that generates a data signal that includes both jitter and a predetermined logic pattern, comprising:
a plurality of delay circuits that are connected in a cascading manner and that sequentially delay a supplied reference signal by a delay amount dependent on an integer multiple of a single bit unit time of the data signal; and
a signal generating section that generates each edge of the data signal according to a timing of the signal output by each delay circuit, wherein
the delay amount of at least one delay circuit is set to be a value obtained by adding or subtracting a jitter value to be injected to or from an integer multiple of the single bit unit time of the data signal.

30. The pattern generator according to claim 29, further comprising a delay setting section that determines what multiple of the single bit unit time of the data signal is used for the delay amount to be set for each delay circuit based on the number of consecutive bits having the same logic value in a logic pattern to be included in the data signal, and sets for each delay circuit a value obtained by adding or subtracting a jitter value to be injected to or from each of the determined delay amounts.

31. The pattern generator according to claim 29, further comprising:
a delay setting section that sets for each delay circuit a value obtained by adding or subtracting a jitter value to be injected to or from a single bit unit of time of the data signal; and
a switch that selects a plurality of signals to be supplied to the signal generating section from among the signals output by the delay circuits based on a logic pattern to be included in the data signal.

32. A test apparatus that tests a device under test, comprising:
a pattern generator that generates a test signal that includes both jitter and a predetermined logic pattern and supplies the test signal to the device under test; and
a measuring section that measures a response signal output by the device under test in response to the test signal and makes a judgment concerning pass/fail of
the device under test based on the measured response signal, wherein
the pattern generator includes:
a plurality of delay circuits that are connected in a cascading manner and that sequentially delay
a supplied reference signal by a delay amount dependent on
an integer multiple of a single bit unit time of the test signal; and
a signal generating section that generates each edge of the test signal according to a timing of the signals output by the delay circuits, and the delay amount of at least one delay circuit is set to be a value obtained by adding or subtracting a jitter value to be injected to or from an integer multiple of the single bit unit time of the test signal.

33. An electronic device that houses a performance circuit and a self diagnostic section that tests the performance circuit, wherein the self diagnostic section includes;
- a pattern generator that generates a test signal that includes both jitter and a predetermined logic pattern and supplies the test signal to the performance circuit; and
- a measuring section that measures a response signal output by the performance circuit in response to the test signal and makes a judgment concerning pass/fail of the performance circuit, the pattern generator includes:
- a plurality of delay circuits that are connected in a cascading manner and that sequentially delay a supplied reference signal by a delay amount dependent on an integer multiple of a single bit unit time of the test signal; and
- a signal generating section that generates each edge of the test signal according to a timing of the signals output by the delay circuits, and the delay amount of at least one delay circuit is set to be a value obtained by adding or subtracting a jitter value to be injected to or from an integer multiple of the single bit unit time of the test signal.

* * * * *